United States Patent [19]

Ogawa et al.

[11] Patent Number: 5,926,057
[45] Date of Patent: *Jul. 20, 1999

[54] SEMICONDUCTOR DEVICE, CIRCUIT HAVING THE DEVICE, AND CORRELATION CALCULATION APPARATUS, SIGNAL CONVERTER, AND SIGNAL PROCESSING SYSTEM UTILIZING THE CIRCUIT

[75] Inventors: Katsuhisa Ogawa, Sendai; Mamoru Miyawaki, Isehara, both of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/590,505

[22] Filed: Jan. 24, 1996

[30] Foreign Application Priority Data

Jan. 31, 1995 [JP] Japan .................................. 7-014093

[51] Int. Cl.$^6$ ....................................................... G05G 7/12
[52] U.S. Cl. ............................................. 327/359; 327/355
[58] Field of Search .................................. 327/355, 358, 327/359, 361, 261, 337, 339, 563, 554, 52, 54, 55, 57, 96, 97, 103

[56] References Cited

U.S. PATENT DOCUMENTS

| | | | |
|---|---|---|---|
| 4,616,185 | 10/1986 | Van Roermund | 327/355 |
| 5,305,250 | 4/1994 | Salam et al. | 327/361 |
| 5,331,222 | 7/1994 | Lin et al. | 327/337 |
| 5,341,050 | 8/1994 | Mellissinos et al. | 327/355 |
| 5,381,352 | 1/1995 | Shou et al. | 364/606 |
| 5,457,417 | 10/1995 | Shou et al. | 327/356 |
| 5,469,102 | 11/1995 | Shou et al. | 327/361 |
| 5,479,130 | 12/1995 | McCartney | 327/337 |
| 5,514,997 | 5/1996 | Quinn | 327/337 |
| 5,565,809 | 10/1996 | Shou et al. | 327/355 |

FOREIGN PATENT DOCUMENTS

| | | |
|---|---|---|
| 2536922 | 1/1984 | France . |
| 2599526 | 12/1987 | France . |

OTHER PUBLICATIONS

Patent Abstracts of Japan, vol. 013, No. 309 (P–898), Jul. 14, 1989 (Kokai 01–081082 of Mar. 27, 1989).

*Primary Examiner*—My-Trang Nu Ton
*Attorney, Agent, or Firm*—Fitzpatrick, Cella, Harper & Scinto

[57] ABSTRACT

One terminals of capacitors are connected to multiple input terminals via first switch means which can select a positive or negative logic of an input signal, and the other terminals of the capacitors are commonly connected (point b) to first differential input of a differential input/output type sense amplifier via second switch. The commonly connected portion of the capacitors are connected to second differential input of the differential input/output type sense amplifier, the second differential input having a polarity opposite to that of the first differential input, thereby suppressing an increase in circuit scale due to an increase in the number of bits, and assuring high-speed arithmetic operations.

23 Claims, 11 Drawing Sheets

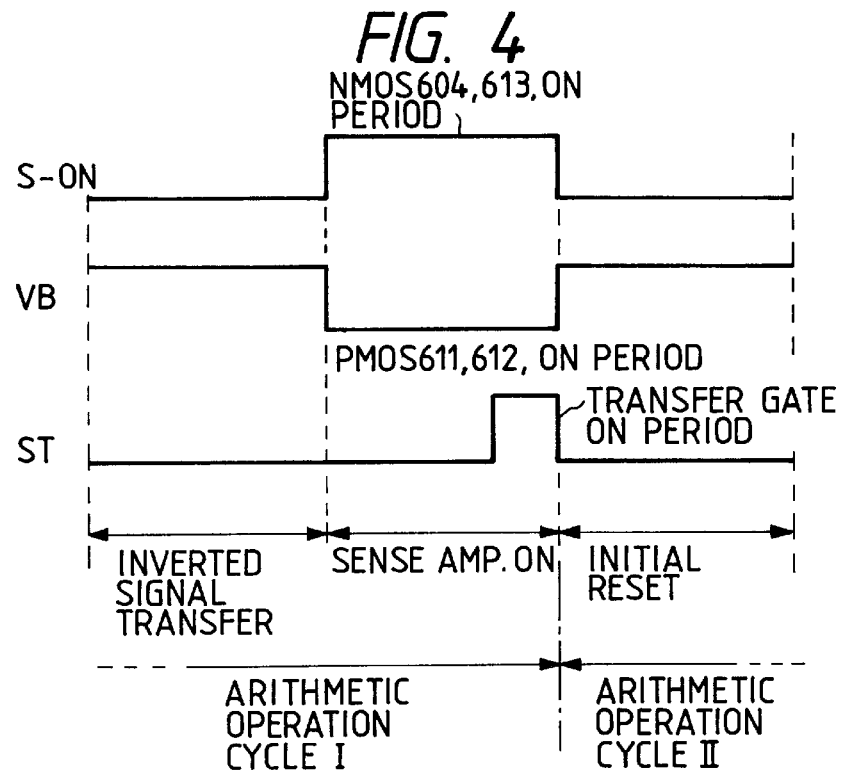
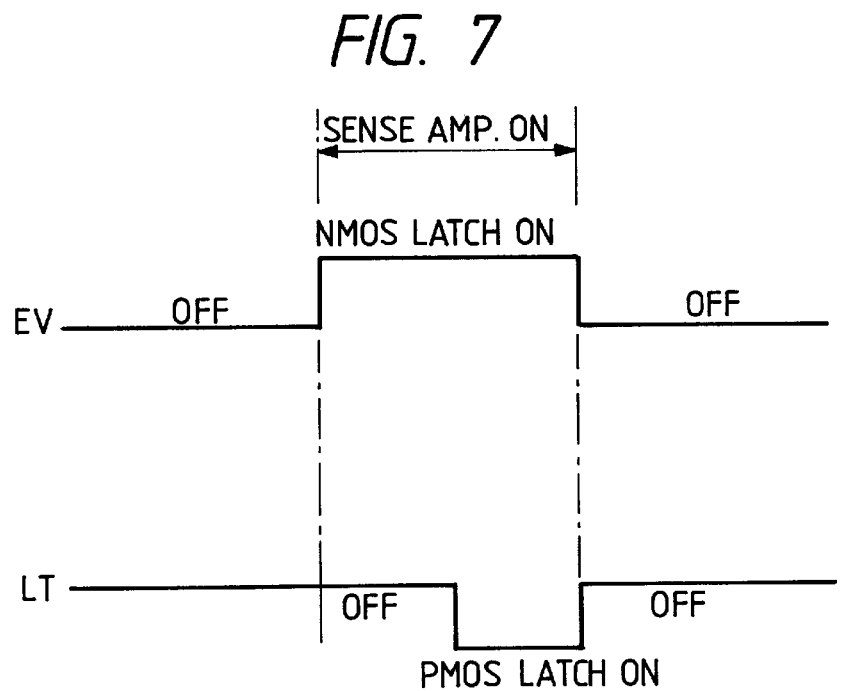

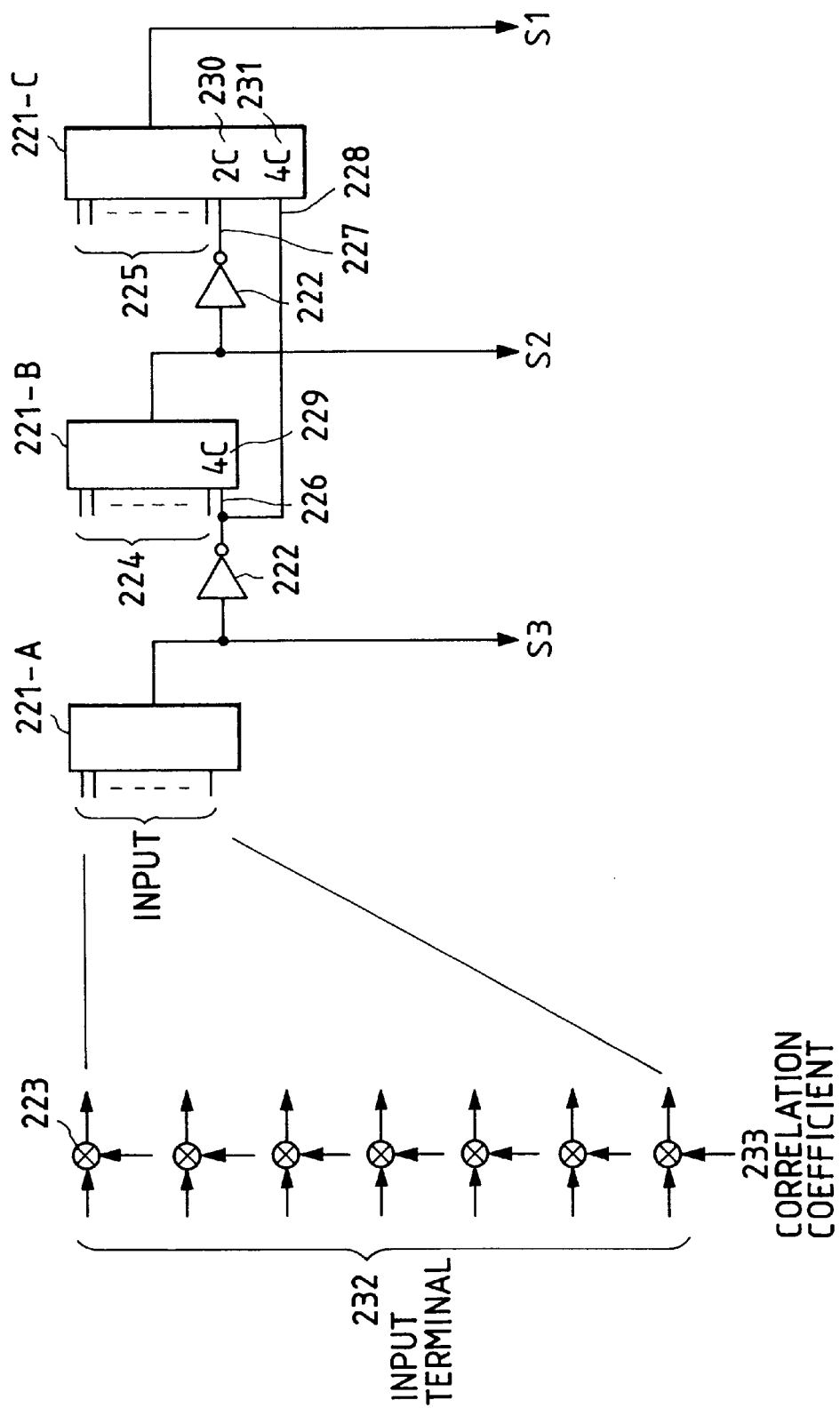

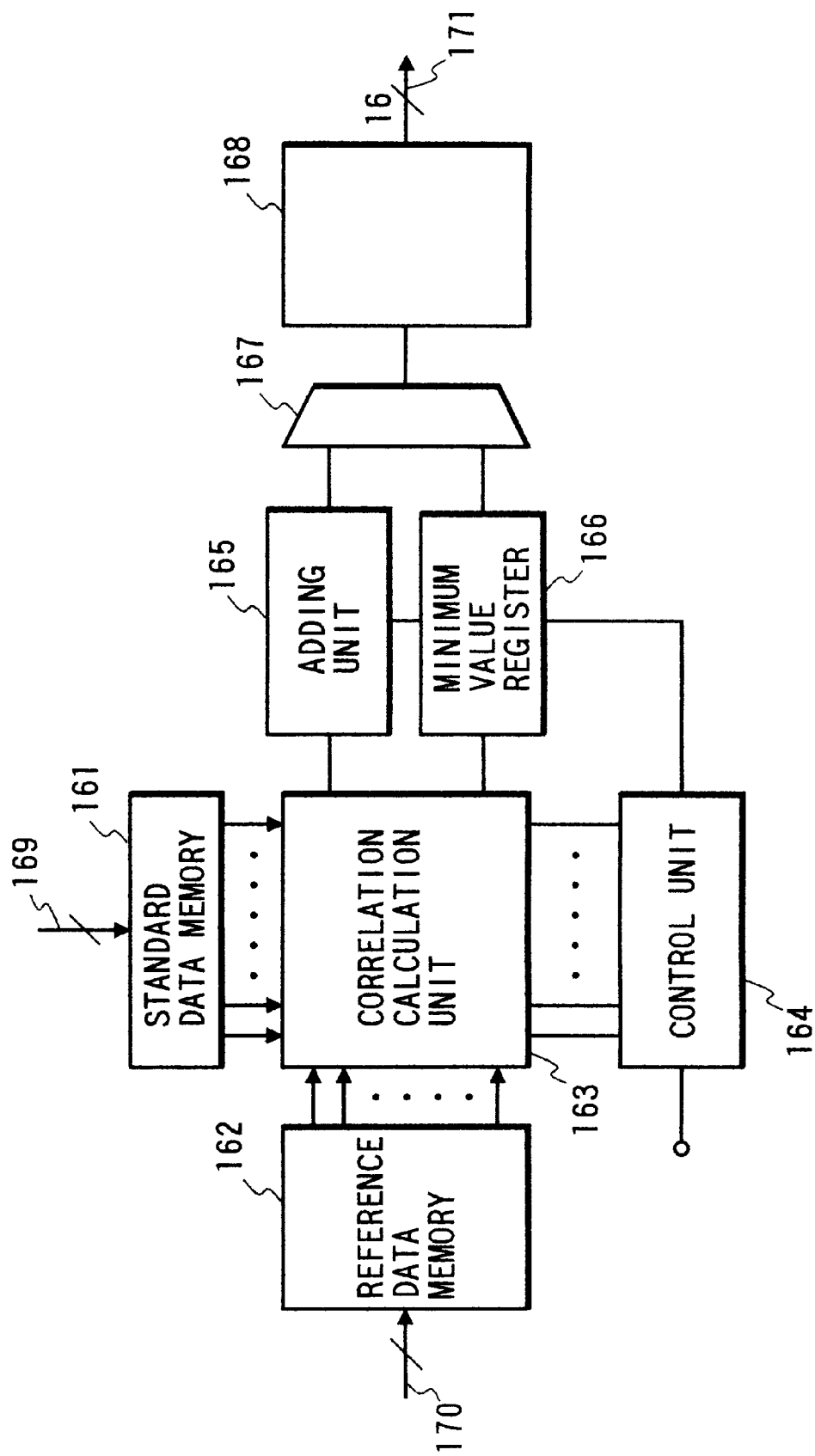

SEMICONDUCTOR DEVICE, CIRCUIT HAVING THE DEVICE, AND CORRELATION CALCULATION APPARATUS, SIGNAL CONVERTER, AND SIGNAL PROCESSING SYSTEM UTILIZING THE CIRCUIT

BACKGROUND OF THE INVENTION

1. Field of the Invention

The present invention relates to a semiconductor device, a circuit having the device, and a correlation calculation apparatus, a signal converter, and a signal processing system utilizing the circuit. More particularly, the semiconductor device is one that allows parallel signal processing, a circuit having the device, and a correlation calculation apparatus, a signal converter including an A/D (analog-to-digital) converter or a D/A (digital-to-analog) converter, and a signal processing system utilizing the circuit.

2. Related Background Art

In recent years, along with an increase in signal processing speed, it has become important to realize low-cost arithmetic operation apparatuses that can process a very large volume of data at high speed. Of these apparatuses, the above demand is even stronger for a correlation apparatus used in motion detection for dynamic images, high-precision analog-to-digital and digital-to-analog converters, and the like.

Since a technique such as a spread spectrum (SS) communication requires high-speed, multiple input signal processing on the GHz order in some cases, a demand for parallel processing of a large volume of data is becoming stronger in addition to further increases in processing speed and precision.

Conventionally, when such functions are realized using a semiconductor integrated circuit, parallel arithmetic operations are attained using a plurality of semiconductor chips so as to attain high-speed arithmetic operation processing. However, since the use of the plurality of semiconductor chips results in an increase in circuit area, an attempt for realizing a one-chip circuit using the latest micropatterning rule has been made.

Despite such attempt, since the conventional circuit arrangement basically has a large circuit scale, it requires a considerably large circuit scale even using the latest micropatterning rule, and circuit integration on one chip involves difficulty.

As is well known, when the number of bits of a signal to be processed increases, the circuit scale of such a chip sharply increases. For example, the circuit scale increases in proportion to the square of the number of bits to be operated on.

Therefore, as the number of bits increases, the manufacturing cost of the apparatus increases, and the apparatus undesirably has a circuit scale that cannot be realized in practice. For example, a motion detection chip of suitable for the MPEG2 method, which has been proposed as a compression/expansion method of dynamic images, has not been integrated on a single chip yet.

SUMMARY OF THE INVENTION

The present invention has been made in consideration of the above situation, and has as its object to provide a semiconductor device that can attain parallel processing, and can process data, especially, a large volume of data, with high precision and at high speed.

It is another object of the present invention to provide a low-cost semiconductor device which can attain a high-speed arithmetic operation.

It is still another object of the present invention to provide a semiconductor device which can prevent the circuit scale from extremely increasing even when the number of bits required for arithmetic operation processing increases.

It is still another object of the present invention to provide a semiconductor device which can attain arithmetic operation processing with low consumption power.

It is still another object of the present invention to provide a semiconductor device, in which one terminals of capacitor means are connected to multiple input terminals via first switch which can select a positive or negative logic of an input signal, the other terminals of the capacitor means are commonly connected to first differential input unit of a differential input/output type sense amplifier via second switch, and the commonly connected portion of the capacitor is connected to second differential input unit of the differential input/output type sense amplifier via third switch, the second differential input unit having a polarity opposite to that of the first differential input unit.

It is still another object of the present invention to provide a circuit having the semiconductor device, such as a correlation calculation apparatus, a signal converter including A/D and D/A converters, and a signal processing system.

BRIEF DESCRIPTION OF THE DRAWINGS

FIG. 4 is a schematic timing chart for explaining an example of the operation of the differential input/output type sensor amplifier;

FIG. 7 is a schematic timing chart for explaining an example of the operation when a latch type sense amplifier shown in FIG. 6 is ON;

FIG. 8 is a schematic circuit diagram for explaining an example in which the present invention is applied to a correlation arithmetic operation circuit;

FIG. 10 is a schematic block diagram for explaining an example in which the present invention is applied to a motion detection circuit;

DETAILED DESCRIPTION OF THE PREFERRED EMBODIMENTS

Figure 1:
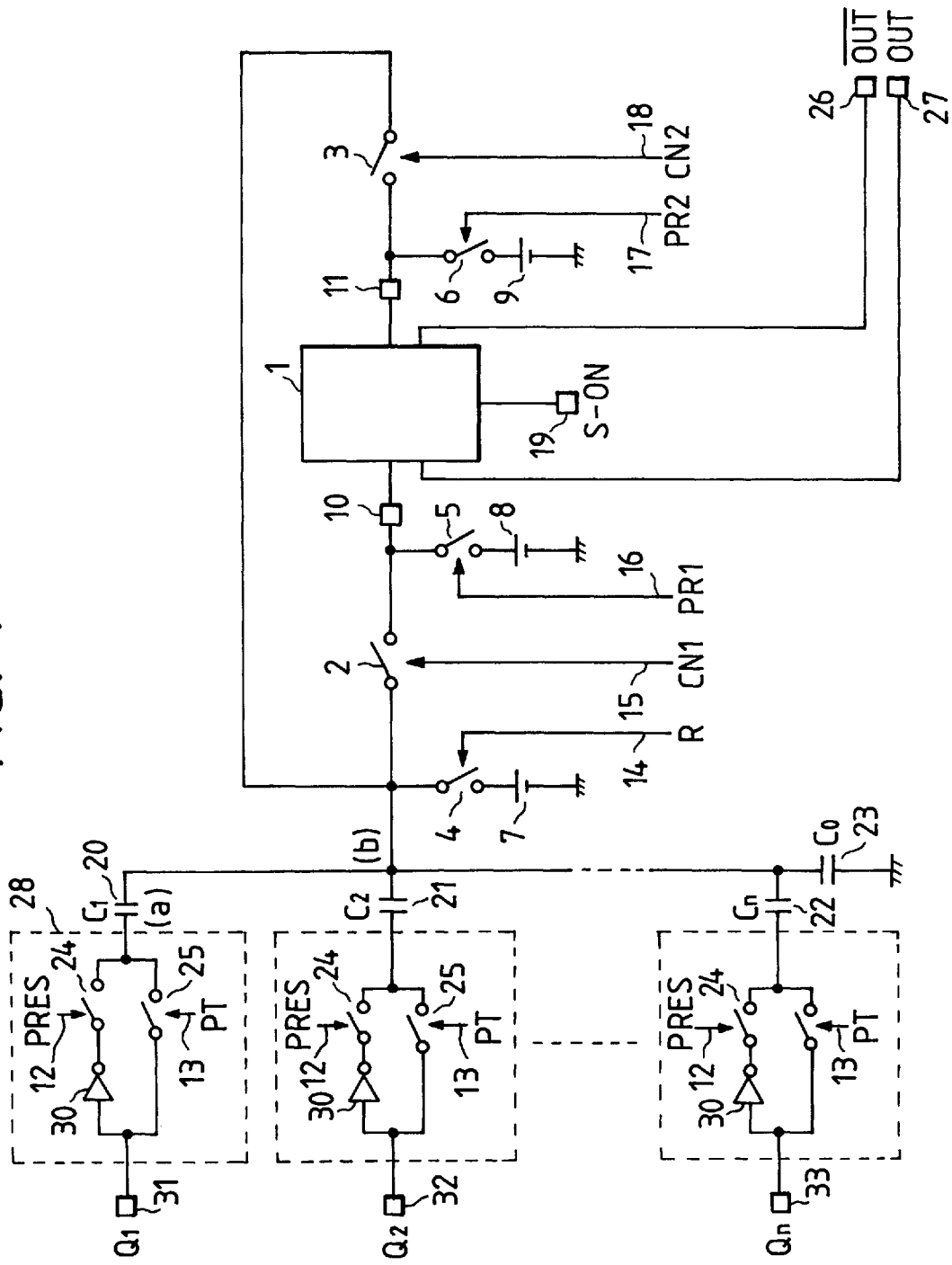
FIGS. 1, 5, and 6 are schematic circuit diagrams for explaining examples of the circuit arrangement according to the present invention.

According to the present invention, by utilizing the potential difference between signals having different polarities and input to a differential input/output type sense amplifier, high-precision processing can be realized.

More specifically, according to the present invention, first switch means that can select a positive/negative logic of an input signal are arranged at multiple input terminals, capacitor means are connected via the first switch means, one terminal of each of the capacitor means is commonly connected to first differential input means of a differential input/output type sense amplifier via second switch means, and the commonly connected portion is also connected to second differential input means of the differential input/output type sense amplifier via third switch means, the second differential input means having a polarity obtained by inverting that of the first differential input means, thereby realizing a semiconductor device which can output a logic amplitude differential output having a polarity according to the input potential difference, and achieving the above-mentioned objects.

In the semiconductor device, the positive and negative logic signal change components (having the same absolute value but opposite polarities), which appear at the commonly connected portion of the multiple input capacitor means via the capacitor means, are written in the first and second differential input terminals of the differential input/output type sense amplifier via the second and third switch means to turn on the differential input/output type sense amplifier, thereby attaining high-precision, high-speed parallel arithmetic operation processing, and reducing the circuit scale and consumption power.

Since high sensitivity is obtained, the number of parallel input signals can be increased (e.g., up to 50 inputs, or even to several hundreds of inputs), the number of parallel processing stages per cycle can be increased, and a high-speed system as a whole can be realized.

A semiconductor circuit has a plurality of semiconductor devices as described above, and inputs the output and/or inverted output of the first semiconductor device of the plurality of semiconductor devices to the second semiconductor device, e.g., majority circuits are slave-connected, thus realizing various functional arithmetic operations with a simple arrangement.

Furthermore, in the semiconductor circuit using the semiconductor devices, when the minimum capacitance of the capacitor means corresponding to the multiple input terminals is represented by C, the total capacitance value of the capacitances of the commonly connected capacitor means is set to be substantially an odd multiple, i.e., exactly or roughly an odd multiple, of the capacitance C, and a plurality of stages of majority circuits are used, thus attaining an integrated circuit on which 3-bit binary circuits with a simple arrangement having a small number of stages are integrated at a high density.

Using the semiconductor device of the present invention, a correlation calculation apparatus for performing a correlation arithmetic operation of inputs at the multiple input terminals, a signal converter such as an A/D converter for inputting an analog signal to the semiconductor device and outputting a digital signal corresponding to the analog signal and a D/A converter for inputting a digital signal to the semiconductor device and outputting an analog signal corresponding to the digital signal, a signal processing system including at least one of the arithmetic operation apparatus, and the signal converter such as the A/D and D/A converters, and the like can be realized. According to the present invention, in any case, an apparatus, a converter, or a signal processing system which can attain precise signal transmission, a small circuit scale, and high-speed processing, and has a broad use range, can be realized. Furthermore, this system can include an image input device for inputting an image signal, and a storage device for storing information, thus further widening the application range of the system.

First Embodiment

FIG. 1 is a schematic circuit diagram according to the first embodiment of the present invention. Referring to FIG. 1, a differential input/output type sense amplifier 1 has a first input terminal 10 (+ input terminal) and a second input terminal 11 (− input terminal). Of course, the first input terminal 10 may serve as the − input terminal, and the second input terminal 11 the + input terminal. The amplifier 1 also has an inverted output terminal 26, and a non-inverted output terminal 27. When the differential input/output type sense amplifier 1 comprises an RS flip-flop type latch differential sense amplifier, since the input and output terminals are commonly used, the first input terminal 10 and the non-inverted output terminal 27 are commonly connected, and the second input terminal 11 and the inverted output terminal 26 are commonly connected. The operation of this amplifier will be described later with reference to FIG. 5. The differential input/output type sense amplifier 1 is ON/OFF-controlled by a control signal 19 S-ON.

On the other hand, at the input stage, n parallel multiple input signals 31, 32, . . . , 33 will be referred to as input signals $Q_1$ to $Q_n$. n input signals are respectively input to reset switch input blocks 28. The operation of each reset switch input block 28 will be described below while taking the input signal $Q_1$ as an example. The input signal $Q_1$ is logically inverted by an inverter 30, and the inverted signal is input to a capacitor $C_1$ 20 via a first signal reset switch 24, thereby logically resetting an input terminal a of the capacitor $C_1$ 20 to the input signal $Q_1$ when the first signal reset switch 24 is turned on (closed). The signal reset switch 24 is controlled by a signal PRES 12. On the other hand, the input signal $Q_1$ is transferred to the capacitor $C_1$ via a signal transfer switch 25 (if closed) without going through the inverter 30. The signal transfer switch 25 is controlled by a transfer control signal PT 13.

Note that the input signal and a signal appearing at a floating node b of the commonly connected terminal of the capacitors have the following relationship. Let $Q_1$ to $Q_n$ be n input signals, and $C_1$ to $C_n$ be input capacitors connected to the respective reset switch input blocks 28. Also, let $\Delta V_1$ to $\Delta V_n$ be the potential change amounts due to the input signals $Q_1$ to $Q_n$ from an initial state when the reset switches 24 are turned on, and $\Delta V_f$ be the potential change amount of the floating node b. The sum total of charges at the floating node b remains the same before and after the signal input (the principle of conservation of charge), and is expressed by equation (1) below:

$$C_1(\Delta V_1 - \Delta V_f) + C_2(\Delta V_2 - \Delta V_f) + \ldots + c_n(\Delta V_n - \Delta V_f) = C_0 \Delta V_f \qquad (1)$$

where $C_0$ is a parasitic capacitance 23 or the like of the floating node b.

When the above equation is modified, we have:

$$\Delta V_f = \frac{\sum_{x=1}^{n} C_x \Delta V_x}{\sum_{x=0}^{n} C_x} [V] \qquad (2)$$

More specifically, the linear sum of potential changes at the respective terminals weighted with $C_x$ is output as a potential change at the floating node b. The input signals $Q_1$ to $Q_n$ can be either analog or digital signals. In the case of analog signals, the circuit can be used as a neuron element for weighting and detecting the magnitudes of inputs at the respective terminals. On the other hand, in the case of digital signals, a majority logic circuit for comparing the numbers of H- and L-level signals of input signals can be constituted. A first reset switch 4 serves as reset means for resetting the floating node b to the potential of a first reset voltage source 7, and is controlled by a control signal R 14. A second reset switch 5 serves as reset means for initially resetting the input terminal 10 of the differential input/output type sense amplifier 1 to the potential of a second reset voltage source 8, and is controlled by a control signal PR1. A third reset switch 6 serves as reset means for resetting the input terminal 11 to the voltage of a second reset power supply 9, and is controlled by a control signal PR2. A first signal transfer switch 2 transfers the input arithmetic operation result at the floating node b to the input terminal 10 of the differential input/output type sense amplifier 1, and is controlled by a control signal 15 CN1. A second signal transfer switch 3 transfers the input arithmetic operation result at the floating node b to the input terminal 11 of the differential input/output type sense amplifier 1, and is controlled by a control signal 18 CN2.

Figure 2:
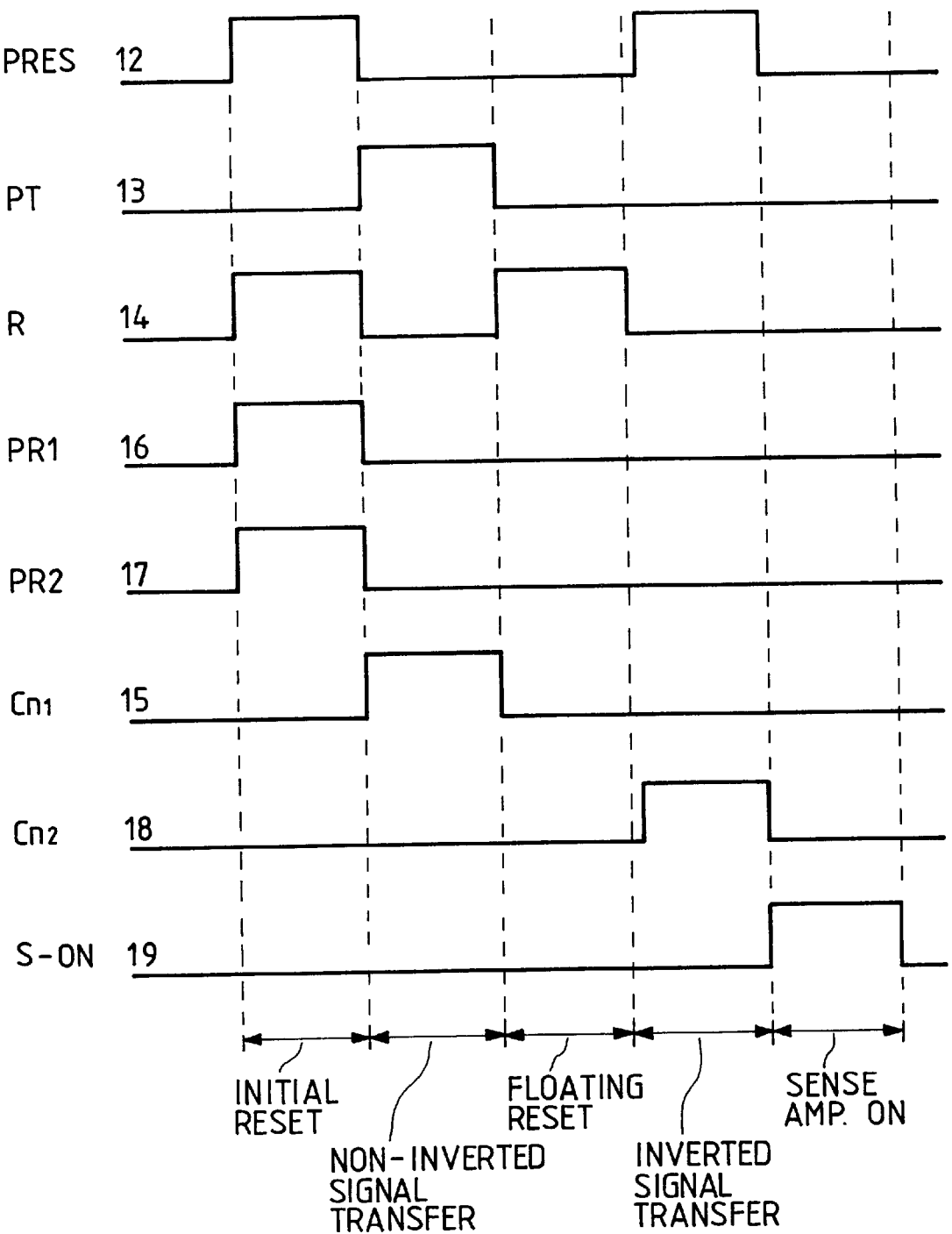
FIG. 2 is a schematic timing chart for explaining an example of the driving timings of the circuit shown in FIG. 1.

FIG. 2 is a timing chart for explaining an example of the operation timings of the circuit of this embodiment shown in FIG. 1. An example of the operation of this embodiment will be described below with reference to FIG. 2.

The logics polarties of signals applied to the input terminals are inverted via the inverters 30. In this state, since the control signal 12 PRES is in the ON state, the input terminals a of the n capacitors $C_1, C_2, \ldots, C_n$ are reset by the values of the inverted logic potentials $Q_1$ (inverted), $Q_2$ (inverted),..., $Q_n$ (inverted) of the input signals $Q_1, Q_2,\ldots,Q_n$ via the signal reset switches 24. At substantially the same time, the first reset switch 4 is turned on by the control signal 14 R and the floating node b as the common terminal of the capacitors is reset to the first reset potential 7. In addition, the second and third reset switches 5 and 6 are turned on by the control signals PRI and PR2, and the input terminals 10 and 11 of the differential input/output type sense amplifier are reset to the second and third reset potentials 8 and 9, respectively. When the power supply voltage is a 5-V system, these reset potentials 7, 8, and 9 preferably use 2.5 V half the power supply voltage. However, the reset potentials are not limited to this voltage, but may be other voltages. The first reset potential 7 need not always be equal to the second and third reset potentials 8 and 9, but may be different from each other. In some cases, the second and third reset potentials 8 and 9 may be DC potentials which are offset by a voltage corresponding to the input offset voltage of the differential input/output type sense amplifier 1 in the opposite direction and cancel the offset components of the differential input/output type sense amplifier 1.

In this manner, a period in which the two terminals of each capacitor and the two terminals of the differential input/output type sense amplifier 1 are reset is called an initial reset period in FIG. 2. When the respective nodes have reached the reset potentials, the reset switches 24, 4, 5, and 6 are turned off, and the two terminals of each capacitor and the potential of the differential input/output type sense amplifier 1 are held at the reset potentials.

When the signal transfer pulse PT is turned on, the signal transfer switches 25 are turned on, and non-inverted signals $Q_1, Q_2, \ldots, Q_n$ are simultaneously transferred to the n capacitors $C_1, C_2, \ldots, C_n$. Assuming that the power supply voltage is a 5-V system and the input signal is a binary signal of 0 V at L level and 5 V (=power supply voltage) at H level, the voltage difference between the initial reset potential and the input signal can be a maximum of 5 V as the signal change component at that time, that is, a potential change equivalent to the power supply voltage can be obtained. Thus, the potential change at the floating node b increases accordingly in correspondence with equation (2). The potential change at the floating node b at that time is given by equation (3) below:

$$\Delta V_f \text{ (non-inverted)} = \frac{\sum_{x=1}^{n} C_x \Delta V_x}{\sum_{x=0}^{n} C_x} \quad (3)$$

where the value of $\Delta V_x$ is $-5$ V (reset potential of 5 V → when input signal is 0 V) or $+5$ V (reset potential of 0 V → when input signal is 5 V), and $C_0$ is the parasitic capacitance or the like of the floating point b.

Subsequently, since the control signal 15 CN1 is ON, the potential variation $\Delta V_f$ (non-inverted) of the floating node b upon change in input signal is transferred to the input terminal 10 of the differential input/output type sense amplifier 1 via the first signal transfer switch 2. When the potential of the input terminal 10 has changed by $\Delta V_f$ (non-inverted) from the second reset potential 8, the control signal CN1 is turned off, and the value is held. In FIG. 2, this period corresponds to a non-inverted signal transfer period.

The floating node b as the common terminal of the capacitors is reset to the first reset potential 7 again via the first reset switch 4 by the control signal R. In FIG. 2, this period corresponds to a floating reset period.

At this time, the input terminals a of the n capacitors $C_1, C_2, \ldots, C_n$ are reset by the non-inverted logics of the input signals, i.e., non-inverted signals $Q_1, Q_2, \ldots, Q_n$. In this state, when the control signal 12 PRES is turned on, the first signal reset switches 24 are turned on, and the input terminals a are reset again by the values of the inverted logic potentials $Q_1$ (inverted), $Q_2$ (inverted) , . . . , $Q_n$ (inverted) of the input signals $Q_1, Q_2, \ldots, Q_n$ via the inverters 30. In this manner, the inverted logics of the signals are transferred to the capacitors $C_1, C_2, \ldots, C_n$ as input signals, thus obtaining a potential change at the floating node b. From equation (2), the potential change $\Delta V_f$ (inverted) at the floating node b at that time is:

$$\Delta V_f \text{ (inverted)} = \frac{\sum_{x=1}^{n} C_x \overline{\Delta V_x}}{\sum_{x=0}^{n} C_x} [V] \quad (4)$$

Since the control signal CN2 is ON, the signal potential variation $\Delta V_f$ (inverted) of the potential at the floating node b is transferred to the input terminal 11 of the differential input/output type sense amplifier 1 via the second signal transfer switch 3. When the potential at the terminal 11 has changed by $\Delta V_f$ (inverted) from the third reset potential 9, the control signal CN2 is turned off, and the value is held. In FIG. 2, this period corresponds to an inverted signal transfer period.

Upon completion of the inverted signal transfer period, the input terminals 10 and 11 of the differential input/output type sense amplifier 1 respectively hold changes from the reset potentials, given by equations (3) and (4). Potentials $V_{IN10}$ and $V_{IN11}$ including the reset potentials and held at the input terminals 10 and 11 are respectively given by equations (5) and (6):

$$V_{IN10} = V_{RESET8} + \Delta V_f \text{ (non-inverted)} = V_{RESET8} + \frac{\sum_{x=1}^{n} C_x \Delta V_x}{\sum_{x=0}^{n} C_x} \quad (5)$$

where $V_{RESET8}$ is the reset potential determined by the second reset potential 8.

$$V_{IN11} = V_{RESET9} + \Delta V_f \text{ (inverted)} = V_{RESET9} + \frac{\sum_{x=1}^{n} C_x \Delta \overline{V_x}}{\sum_{x=0}^{n} C_x} \quad (6)$$

where $V_{RESET9}$ is the reset potential determined by the third reset potential 9.

Assuming that $V_{RESET8} = V_{RESET9}$, the differential input potential difference $\Delta V_{IN}$ of the differential input/output type sense amplifier 1 is given by:

$$\Delta V_{IN} = \quad (7)$$

$$V_{IN10} - V_{IN11} = V_{RESET8} + \frac{\sum_{x=1}^{n} C_x \Delta V_x}{\sum_{x=0}^{n} C_x} - \left( V_{RESET9} + \frac{\sum_{x=1}^{n} C_x \Delta \overline{V_x}}{\sum_{x=0}^{n} C_x} \right) =$$

$$\frac{\sum_{x=1}^{n} C_x \Delta V_x - \sum_{x=1}^{n} C_x \Delta \overline{V_x}}{\sum_{x=0}^{n} C_x}$$

wherein $\left[\sum_{x=1}^{n} \Delta V_x\right]$ and $\left[\sum_{x=1}^{n} -\Delta V_x\right]$ Since the above formula (8) have equal absolute values of linear sums, and opposite +/− signs ($\Delta V_x = -\Delta V_x$ (inverted)), equation (7) can be modified as follows:

$$\Delta V_{IN} = \frac{\sum_{x=1}^{n} C_x \Delta V_x - \sum_{x=1}^{n} C_x \Delta \overline{V_x}}{\sum_{x=0}^{n} C_x} = \frac{2 \sum_{x=1}^{n} C_x \Delta V_x}{\sum_{x=0}^{n} C_x} \quad (9)$$

As described above, when the power supply voltage is, e.g., a 5-V system, $\Delta V_x$ given by equation (9) is a maximum of 5 V. Since the signal change $\Delta V_+$ (non-inverted) of the input terminal 10 by the non-inverted logic signal transfer and the signal change $\Delta V_+$ (inverted) of the input terminal 11 by the inverted logic signal transfer are received by the differential input operations of the differential input/output type sense amplifier 1, they become twice as large as the signal change on one side, as shown in equation (9). In this manner, the potential changes from the reset potentials as the capacitive arithmetic operation results can be increased before the differential input/output type sense amplifier 1, as shown in equation (9), and the sense amplifier 1 can perform high-precision, high-speed processing.

Next, while the differential input potential difference $\Delta V_{IN}$ given by equation (9) is held at the differential input terminals, the sense amplifier 1 is turned on by the control signal 19 S-ON. With this operation, upon reception of the large differential input potential difference $\Delta V_{IN}$, the differential input/output type sense amplifier 1 is enabled, and parallelly discriminates the arithmetic operation results with high precision and at high speed. Then, the sense amplifier 1 supplies a non-inverted output OUT 27 and an inverted output OUT 26 to the next stage as differential outputs.

When the differential input/output type sense amplifier 1 is set to have a higher gain, the number of parallel signals to be processed can be increased (up to 50 inputs, or even several hundreds of inputs), and the arithmetic operation speed of the entire processing system can be improved.

Figure 3:
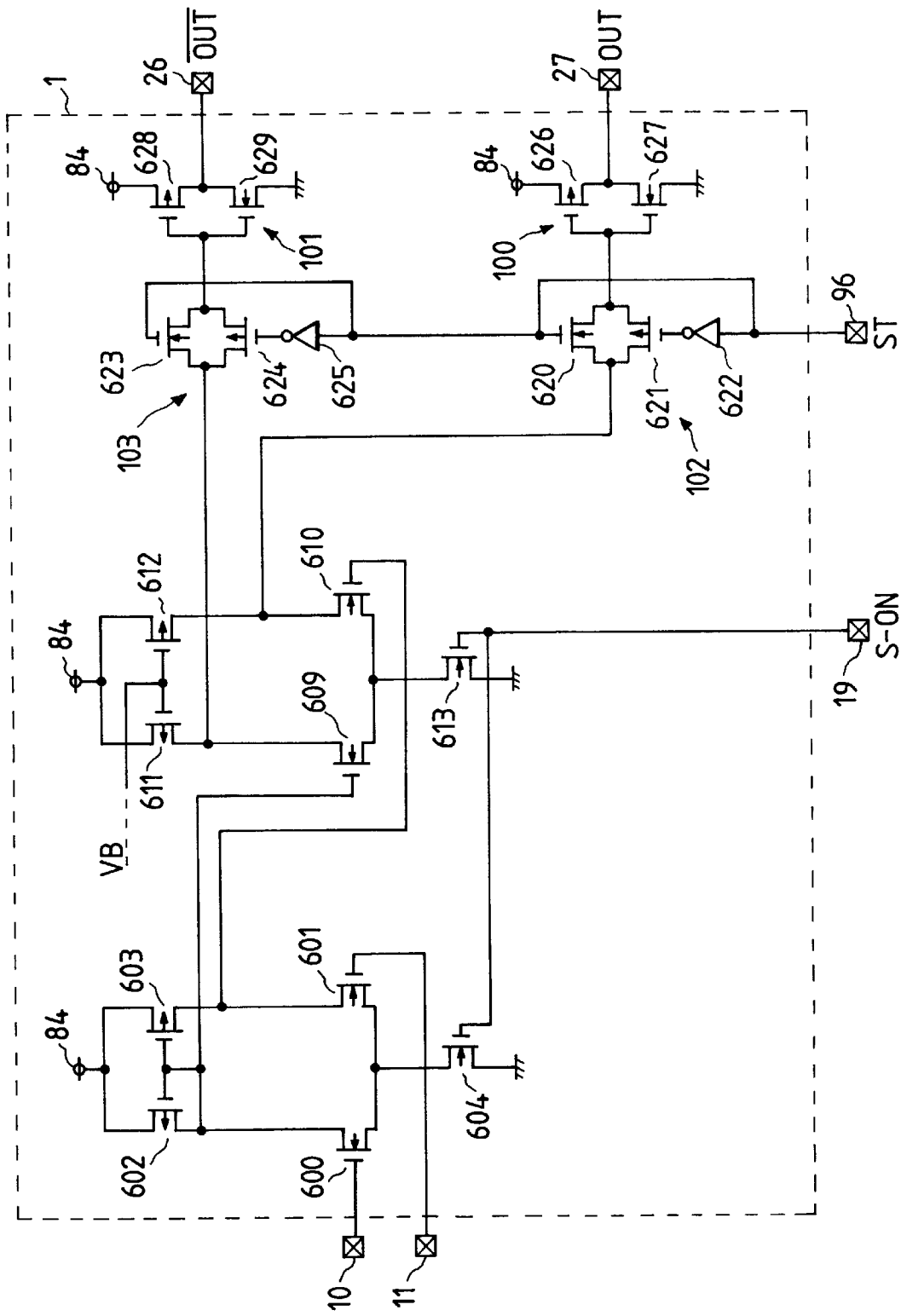
FIG. 3 is a schematic circuit diagram for explaining an example of a differential input/output type sensor amplifier.

FIG. 3 shows an example of the arrangement of the differential input/output type sense amplifier 1. Since the same reference numerals in FIG. 3 denote parts having the same functions as in FIG. 1, a detailed description thereof will be omitted. In FIG. 3, the differential potential given by equation (8) is held between the + and − input terminals 10 and 11 of the differential input/output type sense amplifier 1 via the processes from the initial reset period to the inverted signal transfer period, as has been described in the embodiment shown in FIG. 1.

Referring to FIG. 3, the voltage at the + input terminal 10 is applied to the gate of an NMOS transistor 600, and the voltage at the − input terminal 11 is applied to the gate of an NMOS transistor 601. The NMOS transistors 600 and 601 constitute a differential pair having a common source terminal, and the source terminal is connected to the drain of an NMOS transistor 604, which performs a constant current operation. The source of the NMOS transistor 604 is connected to the GND potential, and its gate is commonly connected to the gate of an NMOS transistor 613. The commonly connected gate is connected to the control signal S-ON 19. When the control signal S-ON 19 is activated, the NMOS transistors 604 and 613 for a constant current source are turned on to serve as a constant current source, and the common source terminal of the NMOS transistors 600 and 601 is connected to the drain of the NMOS transistor 604.

The differential pair, i.e., the NMOS transistors 600 and 601 are turned on. In this state, active loads, i.e., a PMOS transistor 602 whose gate-drain path is connected to the drain of the NMOS transistor 600, and a PMOS transistor 603 whose drain is connected to the drain of the NMOS transistor 601 begin to operate. The source of the PMOS transistor 602 is connected to a power supply $V_{dd}$ 84, its gate is short-circuited to its drain, and the gate-drain path is connected to the drain of the NMOS transistor 600 and the gate of the PMOS transistor 603, and is connected, as an output, to the gate of an NMOS transistor 609 as one transistor of a differential pair in the next stage.

The source of the PMOS transistor 603 is connected to the power supply $V_{dd}$ 84, and its drain is connected to the drain of the NMOS transistor 601. The contact between these two drains is connected, as an output, to the gate of an NMOS transistor 610 as the other transistor of the differential pair in the next stage.

The NMOS transistors 609 and 610 constitute a differential pair having a commonly connected source terminal, which is connected to the drain of the NMOS transistor 613. The drains of the NMOS transistors 609 and 610 are connected to the drains of PMOS transistors 611 and 612 serving as active loads. The sources of the PMOS transistors 611 and 612 are connected to the power supply $V_{dd}$ 84, and their gates are commonly connected to a voltage source $V_B$. The voltage source $V_B$ supplies a voltage for turning on/off the PMOS transistors 611 and 612 in synchronism with the control signal S-ON. More specifically, when the control signal S-ON is logically active, the NMOS transistors 604 and 613 for the constant current source are turned on, and in synchronism with this turn-on operation, the voltage source $V_B$ generates a voltage for switching the PMOS transistors 611 and 612 from the OFF state to the ON state. As a result, the PMOS transistors 611 and 612 are turned on, and serve as active loads of the constant current source.

During the sense amplifier ON period shown in FIG. 2, the control signal S-ON is activated to form an initial differential amplifier consisting of the input stage NMOS differential pair (600 and 601) and the active PMOS loads 602 and 603, and the next stage differential amplifier consisting of the input stage NMOS differential pair (609 and 610) and the constant current PMOS loads 611 and 612, thus turning on the block of the differential input/output type sense amplifier 1. In this state, the differential voltage $\Delta V_{IN}$ between the + and − input terminals 10 and 11 is amplified by the two differential CMOS amplifiers and appears at the drains of the next stage differential pair (609 and 610) as differential outputs with a large amplitude. Then, in a transfer gate 102 consisting of NMOS and PMOS transistors 620 and 621 connected to the NMOS transistor 610 and a transfer gate 103 consisting of NMOS and PMOS transistors 623 and 624 connected to the drain of the NMOS transistor 609, when a control signal ST changes to high level, i.e, is turned on, the NMOS transistors 620 and 623 are turned on, and the PMOS transistors 621 and 624 are turned on by setting their gates at L via inverters 622 and 625.

As a result, when voltages as the differential outputs obtained by the second differential CMOS amplifier are supplied to the transfer gates 102 and 103, an inverter 100 consisting of NMOS and PMOS transistors 626 and 627 in the next stage outputs a non-inverted output, and an inverter 101 consisting of NMOS and PMOS transistors 628 and 629 in the next stage outputs an inverted output. At this time, simultaneously with the turn-off operation of the control signal S-ON, the transfer gates 102 and 103 are turned off. In this manner, one arithmetic operation cycle is completed.

Even when the transfer gates 102 and 103 are ON, the gate voltages are held, and the outputs hold the previous output states until the next arithmetic operation cycle. In this state, the signals are transferred to the next stage, and the differential input/output type sense amplifier 1 waits for processing in the next cycle. FIG. 4 is a timing chart of S-ON, $V_B$, and ST. FIG. 4 shows the operation from the inverted signal transfer period to the next initial reset period in FIG. 2, and shows the timing relationship among the control signal S-ON for operating the sense amplifier 1, the inverted voltage source $V_B$ synchronized with the signal S-ON, and the control signal ST for controlling the transfer gates 102 and 103 in the output section of the sense amplifier 1. Even when the control signal ST changes from high level to low level, the outputs hold the output states.

Second Embodiment

The second embodiment according to the present invention will be described below with reference to FIG. 5. The same reference numerals in FIG. 5 denote parts having the same functions as in FIG. 1, and a detailed description thereof will be omitted. In this embodiment, the differential input/output type sense amplifier 1 comprises a latch type sense amplifier. The input terminal 10 in FIG. 1 directly becomes an output signal OUT 27, which is supplied to the next stage. Similarly, the input terminal 11 in FIG. 1 directly becomes an output signal OUT (inverted) 26, and supplies the inverted logic of the output signal OUT to the next stage.

The operation will be described below with reference to FIG. 2. The operations from the initial reset period to the inverted signal transfer period are the same as those in the first embodiment, and a difference voltage given by equation (10) below is generated at the input/output terminals 10 and 11 in FIG. 5:

$$\Delta V_{IN} = \frac{2\sum_{x=1}^{n} C_x \Delta V_x}{\sum_{x=0}^{n} C_x} \quad (10)$$

The differential input/output type sense amplifier comprises an RS latch constituted by inverters 31 and 32, and the latch type sense amplifier 1 is ON/OFF-controlled by the control signal S-ON.

After the lapse the inverted signal transfer period shown in FIG. 2, assume that the potential relationship between the input terminals 10 and 11 of the latch type sense amplifier 1 satisfies $V_{IN10} > V_{IN11}$, and also satisfies:

$$|V_{IN10} - V_{RESET8}| = |V_{IN11} - V_{RESET9}| = \frac{\sum_{x=1}^{n} C_x \Delta V_x}{\sum_{x=0}^{n} C_x} \quad (11)$$

Then, equation (11) can be rewritten as equation (12) or (13) below:

$$V_{IN10} = V_{RESET8} + \frac{\sum_{x=1}^{n} C_x \Delta V_x}{\sum_{x=0}^{n} C_x} \quad (12)$$

$$V_{IN11} = V_{RESET9} - \frac{\sum_{x=1}^{n} C_x \Delta V_x}{\sum_{x=0}^{n} C_x} \quad (13)$$

for $V_{RESET8} = V_{RESET9}$

When the latch type sense amplifier 1 is turned on by setting the control signal S-ON at high level while holding the potentials given by equations (12) and (13) at the input terminals 10 and 11, the potential $V_{IN10}$ higher than the reset potential of the input terminal 10 drifts to a higher potential due to the positive feedback effect of the latch type sense amplifier 1, and finally stabilizes at the power supply voltage $V_{dd}$.

On the other hand, the potential $V_{IN11}$ lower than the reset potential of the input terminal 11 similarly drifts to a lower potential due to the positive feedback effect, and finally stabilizes at the GND potential. Similarly, when $V_{IN10} < V_{IN11}$, the potential of the input terminal 10 finally stabilizes at the GND potential, and that of the input terminal 11 finally stabilizes at the power supply voltage $V_{dd}$. In this manner, when the differential input terminals are set to have a large potential difference before the latch type sense amplifier 1 is turned on, a high-precision, high-speed arithmetic operation can be realized. When the sensitivity of the latch type sense amplifier 1 is improved, multiple input (e.g., 50 to several hundreds of inputs) arithmetic operations can be attained, and the number of parallel arithmetic operations can be improved, resulting in high arithmetic operation speed of the signal processing system. In this embodiment, the latch type sense amplifier itself has a data storage function, and can hold data until the next arithmetic operation. For this reason, when the number of parallel arithmetic operations increases, and signals to be transferred to the next stage are delayed relative to each other due to the delay time of the connection wiring lines, or noise is mixed in signals due to crosstalk, the outputs from the latch type sense amplifier can consequently realize high-precision signal transmission according to fundamental arithmetic operation clocks since they are latched, thus assuring high-precision parallel arithmetic operation processing.

The input terminals 10 and 11 of the latch type sense amplifier can transfer the arithmetic operation result OUT and the inverted logic output of the arithmetic operation result OUT to the next stage. For this reason, these outputs can be transferred to the next stage as differential outputs. When the next processing system has multiple input terminals shown in the input stage of FIG. 1 or 5, the output signal OUT 27 and the inverted signal OUT (inverted) 26 can be directly connected to the signal transfer switches 25 and the signal reset switches 24 connected to the input arithmetic operation capacitors without using the inverters 30 in the reset switch blocks 28 in the subsequent processing, since these signals have opposite logic levels, thus simplifying the circuit arrangement and reducing the consumption power.

Third Embodiment

The third embodiment according to the present invention will be described below with reference to FIG. 6. The same reference numerals in FIG. 6 denote parts having the same functions as in FIG. 5, and a detailed description thereof will be omitted. The circuit operation of this embodiment will be described with reference to FIG. 2, but the detailed timings during the sense amplifier ON period will be independently described with reference to FIG. 7.

Figure 5:
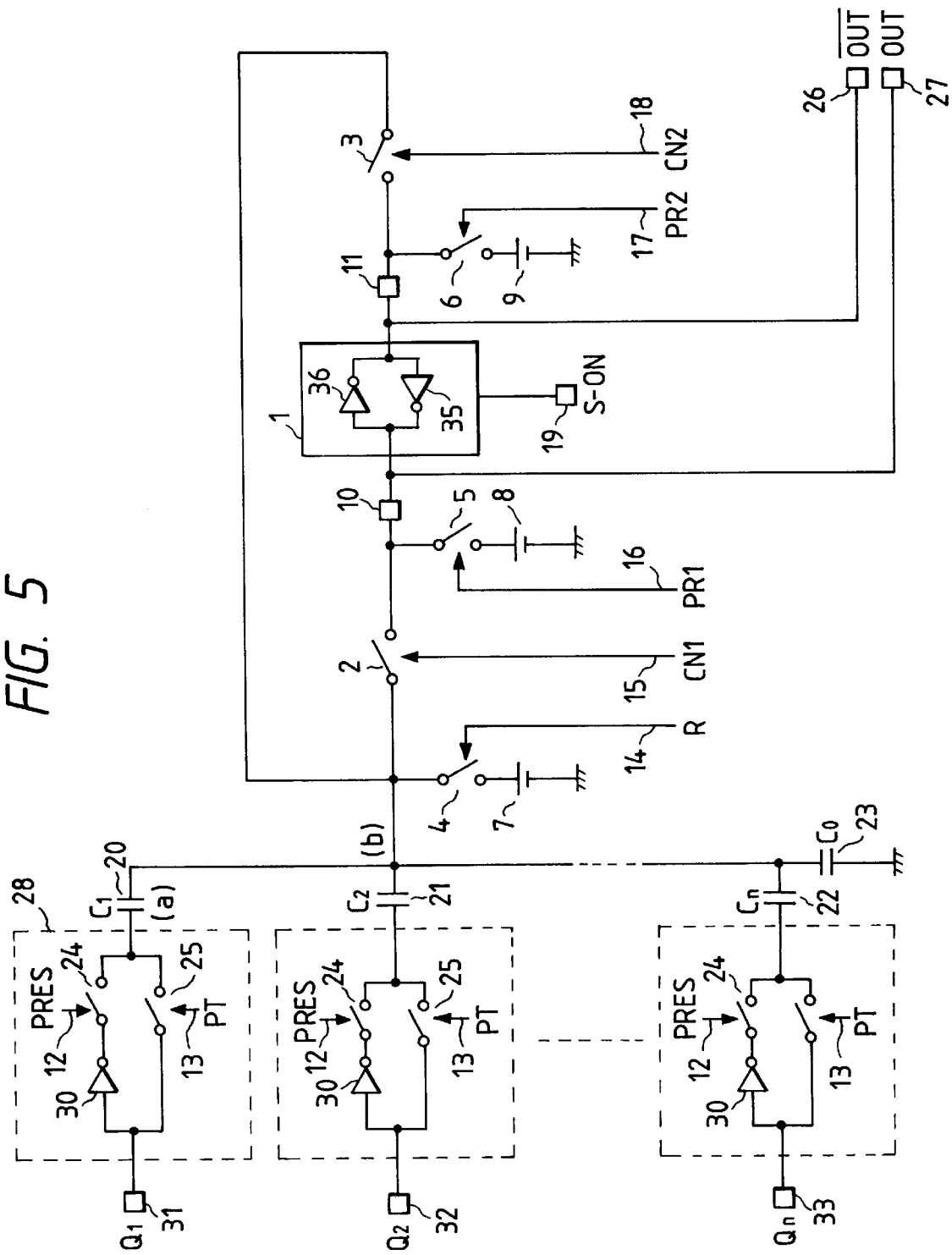
Figure 6:
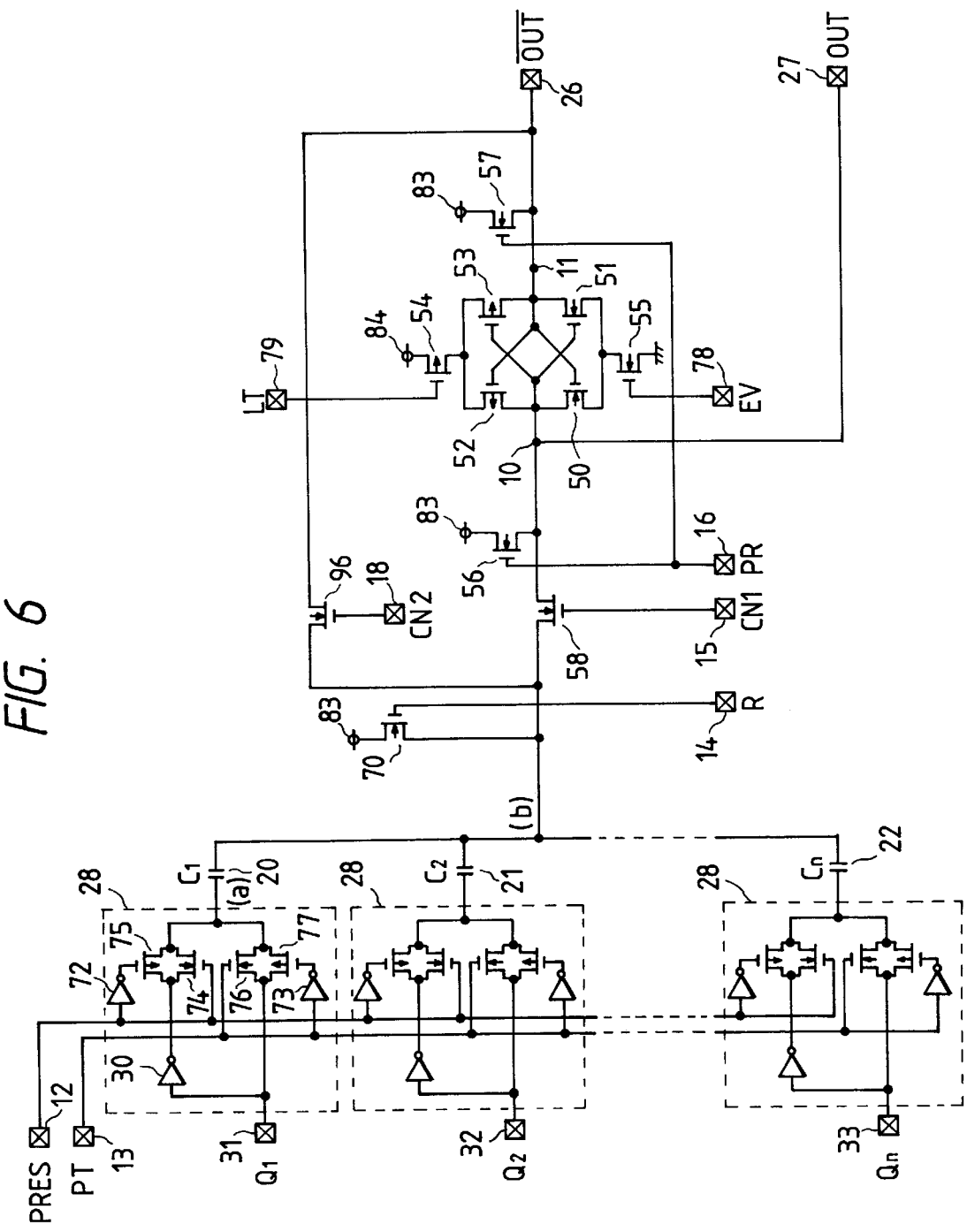

In FIG. 6, in each reset switch input block 28, the first signal reset switch 24 in FIG. 5 is constituted by an NMOS transistor 74, a PMOS transistor 75, and an inverter 72, and serves as a transfer gate for the signal reset switch. The switch 24 is turned on when the control signal PRES 12 is at H, and resets the input terminal a of the capacitor $C_1$ to the inverted logic of the input signal $Q_1$.

In the reset switch input block 28, the signal transfer switch 25 in FIG. 5 serves as a transfer gate for signal transfer constituted by an NMOS transistor 76, a PMOS transistor 77, and an inverter 30 in FIG. 6. The switch 25 is turned on when the control signal PT 13 is at H, and writes the non-inverted logic of the input signal $Q_1$ at the input terminal a of the capacitor $C_1$. On the other hand, the first reset switch 4, the second reset switch 5, the third reset switch 6, the non-inverted logic signal transfer switch 2, and the inverted logic signal transfer switch 3 in FIG. 5 respectively correspond to NMOS transistors 70, 56, 57, 58, and 96. A reset potential 83 is a target potential to converge when the respective nodes are turned on by the corresponding switches. In this case, the first, second, and third reset switches are given an identical reset potential 83.

In the timing chart shown in FIG. 2 that explains the operation of this embodiment, the corresponding switches are turned on/off from the initial reset period to the inverted signal transfer period, and nodes 10 and 11 of the input terminals have a potential difference given by the following equation (14):

$$\Delta V_{IN} = \frac{2\sum_{x=1}^{n} C_x \Delta V_x}{\sum_{x=0}^{n} C_x} \quad (14)$$

When the potential relationship between the input terminals 10 and 11 as the nodes satisfies $V_{IN10} > V_{IN11}$, if the reset potential 83 is represented by $V_{RESET83}$, potentials $V_{IN10}$ and $V_{IN11}$ are respectively given by equations (15) and (16) below:

$$\text{Input terminal 10}: V_{IN10} = V_{RESET83} + \frac{\sum_{x=1}^{n} C_x \Delta V_x}{\sum_{x=0}^{n} C_x} \quad (15)$$

$$\text{Input terminal 11}: V_{IN11} = V_{RESET83} - \frac{\sum_{x=1}^{n} C_x \Delta V_x}{\sum_{x=0}^{n} C_x} \quad (16)$$

The input terminals 10 and 11 as the nodes are held at the potentials given by equations (15) and (16).

In this state, as shown in FIG. 7, during the sense amplifier ON period, a signal EV is turned on to set an NMOS transistor 55 in the ON state. At this time, NMOS transistors 50 and 51 having a common source terminal serve as a differential NMOS latch. In this case, since the NMOS transistor 51 is turned on, and the NMOS transistor 50 is turned off, these transistors drain the charges accumulated on the input terminal 11 and the potential, as the lower potential, of the input terminal 11 (the node between the drain of the NMOS transistor 51 and the gate of the NMOS transistor 50) drifts to the GND potential due to the positive feedback effect while the potential, as the higher potential, of the input terminal 10 (the node between the drain of the NMOS transistor 50 and the gate of the NMOS transistor 51) is held. In this manner, when a potential difference larger than an initial potential difference is generated between the input terminals 10 and 11, a control signal LT 79 changes from H to L to turn on a PMOS transistor 54. The source of the PMOS transistor 54 is connected to a power supply $V_{dd}$ 84, and when the PMOS transistor 54 is turned on, PMOS transistors 52 and 53 having a common source terminal serve as a differential PMOS latch. As a result, since the NMOS and PMOS latches are completely turned on, the potential, as the lower potential, of the input terminal 11 (the node between the drain of the NMOS transistor 51 and the gate of the NMOS transistor 50) quickly approaches the GND potential due to the positive feedback effect, and the potential of the input terminal 10 (the node between the drain of the NMOS transistor 50 and the gate of the NMOS transistor 51) approaches the power supply voltage 84 due to the positive feedback effect since the potential of the input terminal 11 quickly drops to the GND potential. In this manner, the input terminal 10 is latched at logic "H", and the input terminal 11 is latched at logic "L".

The output signal OUT 27 from the node 10 and the output signal OUT (inverted) 26 from the node 11 are respectively transferred to the next stage as differential outputs.

When the potential relationship between the input terminals 10 and 11 satisfies $V_{IN10} < V_{IN11}$, the input terminal 10 is latched at logic "L" and the input terminal 11 is latched at logic "H" by a similar positive feedback operation.

As described above, when differential signals having a large potential difference therebetween are input to the signal input terminals of the latch type sense amplifier, high-precision, high-speed processing is assured.

By increasing the positive feedback gain of the latch type sense amplifier, multiple input arithmetic operations (e.g., 50 to several hundreds of inputs) can be realized, thereby improving the number of parallel arithmetic operations and increasing the arithmetic operation speed of the processing system.

The latch type sense amplifier itself has a data storage function, and can hold data until the next arithmetic operation. For this reason, when the number of parallel arithmetic operations increases, and signals to be transferred to the next stage are delayed relative to each other due to the delay time of the connection wiring lines, or noise is mixed in signals due to crosstalk, the outputs from the latch type sense amplifier can consequently realize high-precision signal transmission according to fundamental arithmetic operation clocks since they are latched, thus assuring high-precision parallel arithmetic operation processing.

The input terminals 10 and 11 of the latch type sense amplifier can transfer the arithmetic operation result OUT 27 and the inverted logic output of the arithmetic operation result OUT 26 to the next stage. For this reason, these outputs can be transferred to the next stage as differential outputs. For this reason, in the subsequent processing, the output signal OUT 27 and the inverted signal OUT (inverted) 26 can be directly input to the input terminal (the node between the sources of the NMOS transistor 74 and the PMOS transistor 75) of the signal transfer gate for the signal reset switch and the input terminal (the node between the sources of the NMOS transistor 76 and the PMOS transistor 77) of the transfer gate for the signal transfer without using the inverters 30 in the reset switch blocks 28 of the next stage, thus attaining a simple circuit arrangement, a consumption power reduction, and an improvement of the processing speed.

Fourth Embodiment

The fourth embodiment in which the above-mentioned semiconductor device is applied to a correlation arithmetic operation circuit will be described below with reference to FIG. 8. In FIG. 8, the correlation arithmetic operation circuit comprises majority arithmetic operation circuit blocks 221-A, 221-B, and 221-C, each having seven input terminals, inverters 222, and comparators 223 for comparing signals at input terminals 232 and corresponding correlation coefficients 233. Input terminals 224 and 225 of the majority arithmetic operation circuit blocks 221-B and 221-C receive the same signals as seven input signals input to the majority arithmetic operation circuit block 221-A. Input terminals 226, 227, and 228 receive output signals from the previous majority arithmetic operation circuit blocks. Capacitors 229, 230, and 231 are connected to the input terminals 226, 227, and 228 and respectively have capacitance values 4C, 2C, and 4C (C is the capacitance connected to a normal input terminal).

Referring to FIG. 8, input signals are input to the comparators 223 together with corresponding correlation coefficients 233. When the input signal coincides with the correlation coefficient 233, each comparator 223 outputs a HIGH-LEVEL signal; otherwise, it outputs a LOW-LEVEL signal. The outputs from the comparators 223 are input to the majority arithmetic operation circuit blocks 221-A to 221-C. For example, when the outputs from the comparators 223 are input to the 7-input majority arithmetic operation circuit block 221-A, if the number of HIGH-LEVEL signals is a majority, i.e., if four or more out of seven inputs are HIGH-LEVEL signals, the majority arithmetic operation circuit block 221-A outputs a HIGH-LEVEL signal. Column S3 in Table 1 below shows this output state.

Similarly, the majority arithmetic operation circuit block 221-B having a total of 11 inputs, i.e., the seven input terminals 224 and the input terminal 226 having a capacitance 4C equivalent to four inputs, outputs a HIGH-LEVEL signal when six or more inputs are HIGH-LEVEL signals. Column S2 in Table 1 below shows this output state. On the other hand, the majority arithmetic operation circuit block 221-C having a total of 13 inputs, i.e., the seven input terminals 225, the input terminal 228 having a capacitance 4C equivalent to four inputs, and the input terminal 227 having a capacitance 2C equivalent to two inputs, outputs a HIGH-LEVEL signal when seven or more inputs are HIGH-LEVEL signals. Column S1 in Table 1 below shows this output state.

More specifically, column S3 shows the output values of the 7-input majority arithmetic operation circuit block in units of the numbers of HIGH-LEVEL signals in the input signals. Subsequently, as shown in FIG. 8, the output from the 7-input majority arithmetic operation circuit block 221-A is inverted by the inverter 222, and the inverted output is applied to the weighted input terminal 226 of the majority arithmetic operation circuit block 221-B. The majority arithmetic operation circuit block 221-B serves as an 11-input majority arithmetic operation circuit in which 11 "C" s are commonly connected, four out of these 11 "C"s receive a signal from the weighted input terminal, and the remaining seven terminals receive the same signals as those input to the majority arithmetic operation circuit block 221-A. For example, when four or more out of seven inputs are HIGH-LEVEL signals, a LOW-LEVEL signal is applied to the weighted input terminal, as described above. Furthermore, when six or more of seven input signals input to the input terminals other than the weighted input terminal are HIGH-LEVEL signals, the 11-input majority arithmetic operation circuit determines a majority as a whole, and outputs a HIGH-LEVEL signal. When four or more and five or less out of seven inputs are HIGH-LEVEL signals, a LOW-LEVEL signal is output since a majority is not determined. On the other hand, when three or less out of seven inputs are HIGH-LEVEL signals, a HIGH-LEVEL signal is applied to the weighted input terminal 226. When two or more and three or less out of seven inputs are HIGH-LEVEL signals, since 4+2 or 4+3 yields 6 or more, a majority is determined, and a HIGH-LEVEL signal is output. On the other hand, when one or less input is a HIGH-LEVEL signal, since 4+0 or 4+1 yields 6 or less, a LOW-LEVEL signal is output. Column S2 in Table 1 shows the output values of the majority arithmetic operation circuit block 221-B in units of the numbers of HIGH-LEVEL signals.

Also, when the inverted signals of the output signals from the majority arithmetic operation circuit blocks 221-A and 221-B are applied to the two weighted input terminals 228 and 227 respectively having ×4 and ×2 capacitance values 4C and 2C, the majority arithmetic operation circuit block 221-C operates to obtain the outputs shown in column S1 in Table 1. With this circuit arrangement, as shown in Table 1, the number of signals that coincide with the correlation coefficients of a plurality of input signals can be converted into a 3-digit binary value, and the binary value can be output.

Fifth Embodiment

Figure 9:
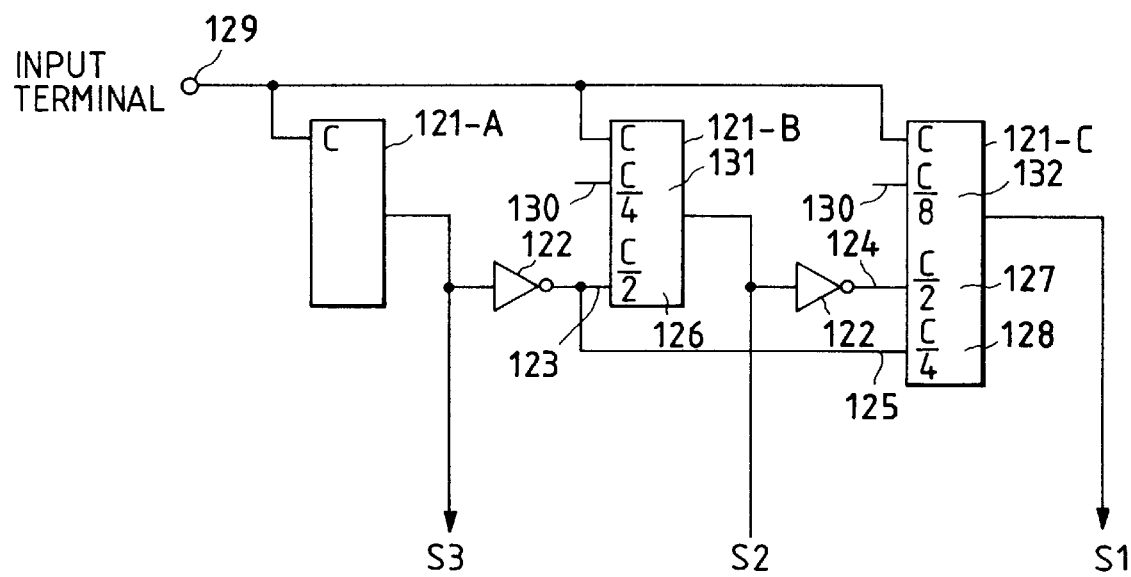
FIG. 9 is a schematic circuit diagram for explaining an example in which the present invention is applied to an A/D converter.

The fifth embodiment will be described below with reference to FIG. 9 and Table 2. This embodiment exemplifies a 3-bit precision analog-to-digital converter (to be referred to as an A/D converter hereinafter) using the present invention. The A/D converter shown in FIG. 9 comprises 1-, 2-, and 3-input arithmetic operation circuit blocks 121-A, 121-B, and 121-C, and inverters 122. Input terminals 123, 124, and 125 receive output signals from the previous arithmetic operation circuit blocks. Capacitors 126, 127, and 128 are connected to the input terminals 123, 124, and 125 and respectively have capacitance values C/2, C/2, and C/4 (C is the capacitance connected to a normal input terminal). An analog input terminal 129 and set input terminals 130 are respectively connected with capacitors 131 and 132 having capacitance values C/4 and C/8. The respective blocks have digital output terminals S1, S2, and S3.

In this embodiment, a case will be exemplified wherein a 5-V system power supply is used. Referring to FIG. 9, the sense amplifier input of the arithmetic operation circuit block 121-A is reset to 0 V, and those of the arithmetic operation circuit blocks 121-B and 121-C are reset to about 2.5 V. The signal input terminals 123, 123, and 125, and the input terminals of the input arithmetic operation capacitors 132 of the set input terminals 130 are reset to 5 V. At this time, the signal input terminal 129 is set at 0 V. Subsequently, assume that the set input terminals 130 are set at 0 V and the input voltage to the input terminal 129 is changed from 0 V to an analog signal voltage. In this case, in the arithmetic operation circuit block 121-A, when the analog input voltage becomes about 2.5 V or higher, the sense amplifier input voltage in the block 121-A exceeds a logic inversion voltage (assumed to be 2.5 V in this case), and a HIGH-LEVEL signal is output. Column S3 in Table 3 shows the output result.

When the analog input signal is 2.5 V or higher, the input terminal 123 changes from 5 V as the reset potential to 0 V. At this time, the potential change at the sense amplifier input terminal in the arithmetic operation circuit block 121-B is given by:

$$\{C \times VA - (C/2) \times 5 - (C/4) \times 5\} / (C + C/2 + C/4) \qquad [V]$$

where VA is the analog input signal voltage.

As can be seen from this equation, the arithmetic operation circuit block 121-B outputs a HIGH-LEVEL signal when the analog signal voltage VA is equal to or higher than 3.7 V, and outputs a LOW-LEVEL signal when the voltage VA is equal to or higher than 2.5 V and lower than 3.75 V. Column S2 in Table 2 shows the output result.

Similarly, the output from the arithmetic operation circuit block 121-C is as shown in column S1 in Table 2.

According to this embodiment, as shown in Table 2, an A/D converter which converts an analog signal voltage into a 3-bit digital signal and outputs the digital signal can be realized by a very small arrangement which assures a high arithmetic operation speed and a low consumption voltage.

This embodiment has exemplified a 3-bit A/D converter. However, the present invention is not limited to this, as a matter of course, and the number of bits can be easily increased.

In this embodiment, a flash type A/D converter using capacitors has been exemplified. However, the present invention is not limited to this. For example, the present invention may be applied to an encoder circuit section of an A/D converter which performs A/D conversion in such a manner that comparators compare signals input to a resistor array and a reference signal, and an encoder encodes the comparison results, thus obtaining the same effects as described above.

As described above, in the circuit block in which one terminal of capacitor means corresponding to multiple input terminals is commonly connected and the common terminal is input to the sense amplifier, a total of the capacitances of the capacitor means is roughly an odd multiple of C which is a minimum one of capacitor means connected to the multiple input terminals.

When a correlation circuit has no control input terminal, all the capacitances connected to the input terminals have a minimum value. On the other hand, when the correlation circuit has control input terminals, as has been described above in, e.g., the fourth embodiment shown in FIG. 8, the capacitances connected to the control input terminals are even multiples of C like 2C and 4C, and the total of the capacitances of these terminals and an odd number of input signal terminals is substantially an odd multiple value of C. With this arrangement, a clear comparison with a desired reference value can be attained, thus improving arithmetic operation precision.

In the above description, the correlation circuit has been exemplified. In the case of a binary D/A converter, if the signal input capacitance of the least significant bit (LSB) is represented by C, the capacitance of the next bit is 2C, that of the second next bit is 4C, and the like, i.e., the capacitance of each bit assumes a value twice as large as the immediately preceding bit, and the total of capacitances of multiple input terminals becomes substantially an odd multiple value of C, thus realizing a high-precision D/A converter.

As for the A/D converter, as described above in the fifth embodiment shown in FIG. 9, the number of discrimination points for discriminating if the analog signal level is higher than or lower than ½ of the full range is set to be an odd number, i.e., 1 (1C) in the block 121-A. In the block 121-B, the number of discrimination points corresponding to discrimination criteria ¼, ²⁄₄, and ¾ is three, i.e., an odd number, and the total of the capacitances has an odd multiple value, 1+2+4=7, to have C/4 as a minimum value. The block 121-C is set to have C/8 (minimum value), C/4, C/2, and C which are doubled sequentially, i.e., an odd multiple value, 1+2+4+8=15.

With this arrangement, since high-precision arithmetic operations can be attained without requiring any unnecessarily large capacitances, low consumption power, and high-speed arithmetic operations can be realized.

In the above description, the correlation arithmetic operation circuit and the A/D converter have been exemplified. However, the present invention is not limited to these units. For example, the present invention may be applied to various other logic circuits such as a digital-to-analog converter, an adder, a subtracter, and the like, thus obtaining the same effects as described above.

Especially, when the present invention is applied to a D/A converter, if the capacitance of the input terminal for receiving LSB data is represented by C, the capacitances need only be set to be twice as large as the immediately preceding value toward the most significant bit like 2C, 4C, 8C, ..., thus realizing a binary D/A converter. In this case, the outputs from the commonly connected terminals of the capacitors can be received by a source follower amplifier.

Sixth Embodiment

The sixth embodiment will be described below with reference to FIG. 10. In the sixth embodiment, the technique of the present invention is applied to a motion detection circuit for, e.g., dynamic images. Referring to FIG. 10, the motion detection circuit comprises memories 161 and 162 for respectively storing standard data and reference data, a correlation calculation unit 163, a control unit 164 for controlling the entire chip, an adding unit 165 for adding the correlation results of the correlation calculation unit 163, a register 166 for storing a minimum value of the sums output from the adding unit 165, a comparison storage unit 167 serving as a comparator and a unit for storing the address of the minimum value, and a unit 168 serving as an output buffer and an output result storage unit. A standard data string is input to an input bus 169, and a reference data string to be compared with the standard data string is input from an input bus 170. The memories 161 and 162 comprise SRAMs, and are constituted by normal CMOS circuits.

Data supplied from the reference and standard data memories 162 and 161 to the correlation calculation unit 163 can be processed by high-speed parallel processing since the unit 163 comprises a correlation arithmetic operation circuit of the present invention. For this reason, the unit 163 can not only attain very high-speed processing, but also be constituted by a smaller number of elements, thus reducing the chip size and cost. The correlation arithmetic operation result is scored (evaluated) by the adding unit 165, and is compared with the contents of the register 166 which stores the maximum correlation arithmetic operation result (minimum sum) before the current correlation arithmetic operation by the comparison/storage unit 167. If the current arithmetic operation result is smaller than the previous minimum value, the current result is newly stored in the register 166; if the previous result is smaller than the current result, the previous result is maintained. With this operation, the maximum correlation arithmetic operation result is always stored in the register 166, and upon completion of the operation of all the data strings, the final correlation result is output as, e.g., a 16-bit signal, from an output bus 171.

The control unit 164, the adding unit 165, the register 166, the comparison/storage unit 167, and the unit 168 are constituted by conventional CMOS circuits in this circuit. In particular, when the adding unit 165 or the like adopts the circuit arrangement including reset circuits of the present invention, a high-precision sense amplifier operation can be realized, and high-speed processing can be realized. As has been described above, not only high-speed processing and low cost are realized but also the consumption current can be reduced since arithmetic operations are executed on the basis of capacitances via the latch circuits, thus realizing low consumption power. For this reason, the present invention is suitably applied to a portable equipment such as an 8-mm VTR camera or the like.

Seventh Embodiment

The seventh embodiment of the present invention will be described below with reference to FIGS. 11A, 11B, and 11C. The seventh embodiment presents a circuit arrangement which performs high-speed image processing before image signal data is read out upon integration of the technique of the present invention and an optical sensor (solid-state image pickup element).

Figure 11A:
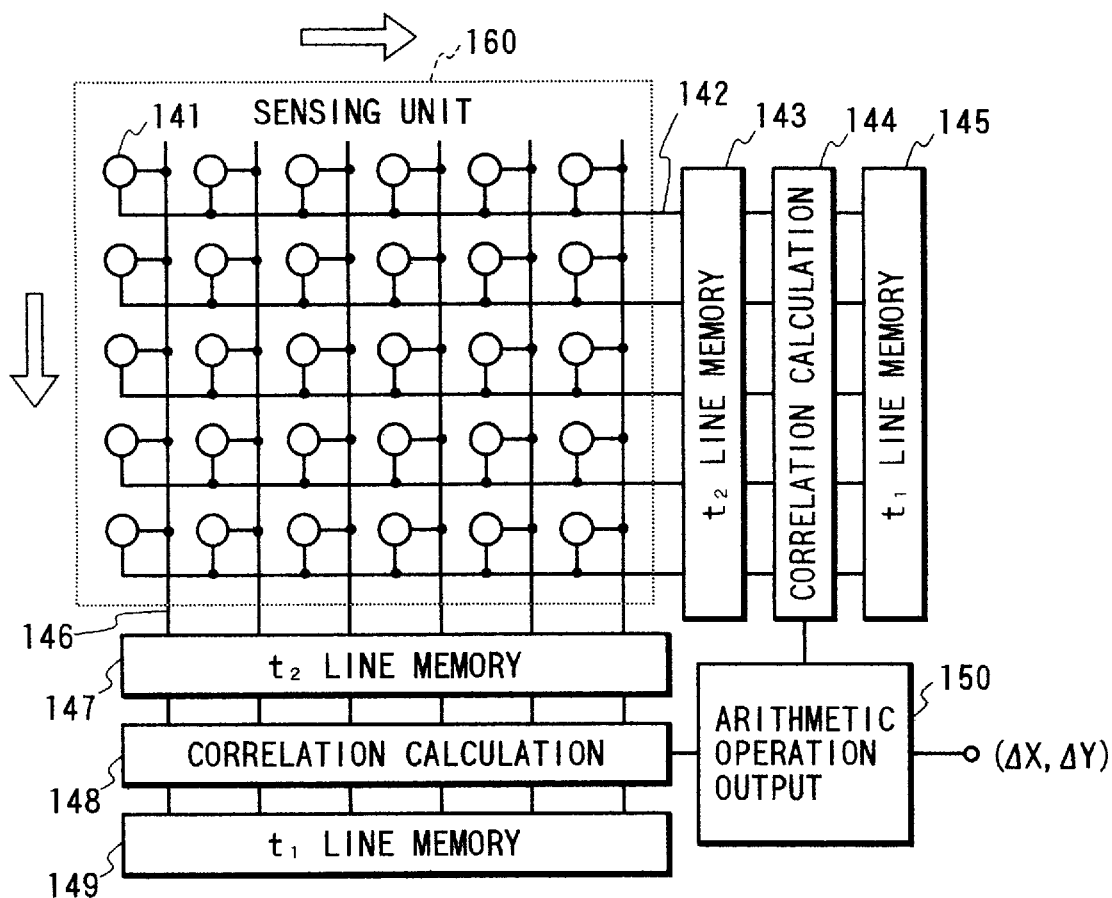
FIG. 11A is a schematic block diagram for explaining an example in which the present invention is applied to a circuit for performing image processing.
Figure 11B:
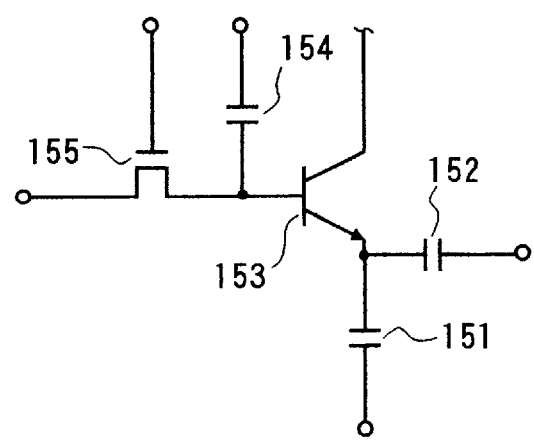
FIG. 11B is a schematic circuit diagram for explaining an example of the circuit arrangement for one pixel of an optical sensor in FIG. 11A.
Figure 11C:
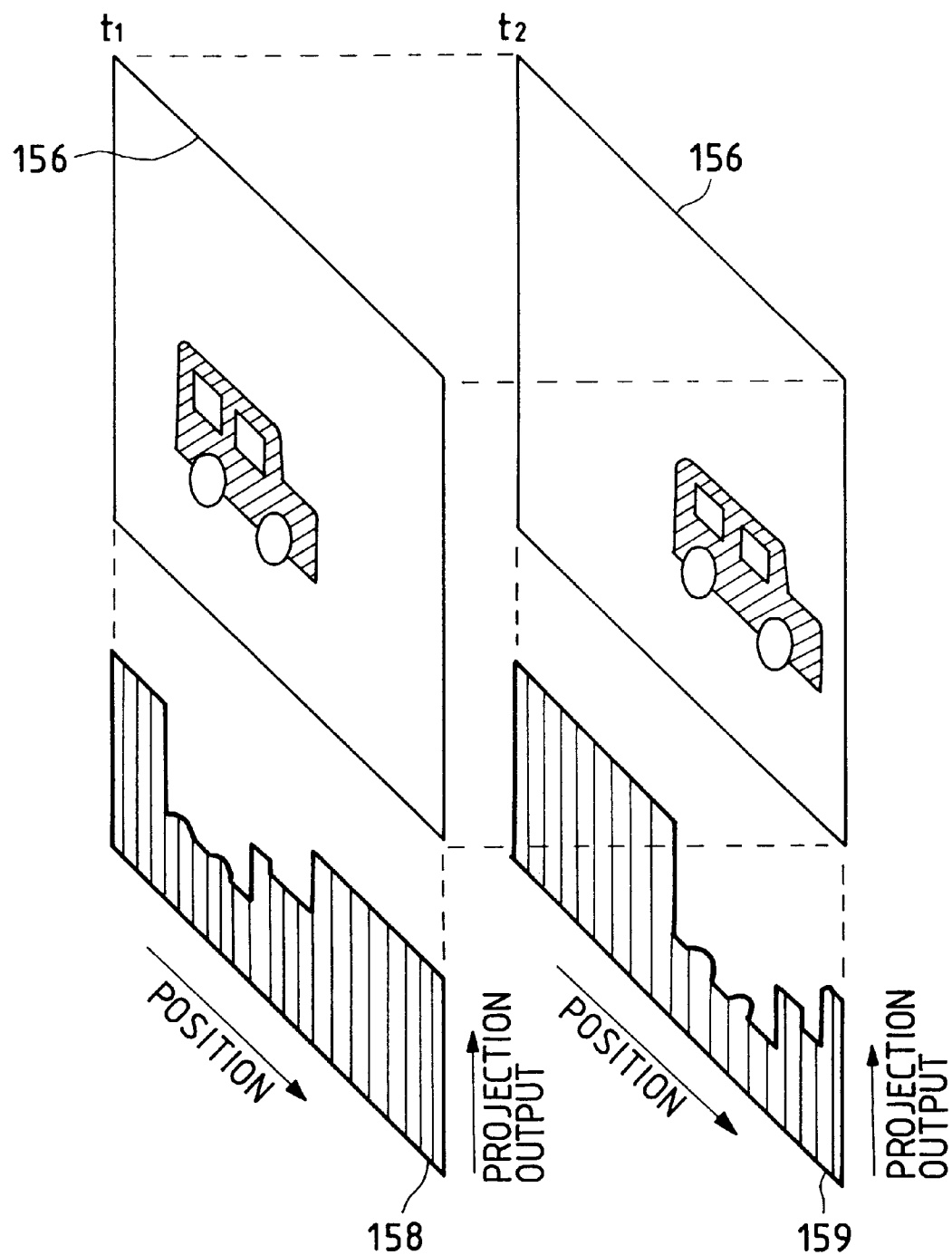
FIG. 11C is a schematic view for explaining an example of the arithmetic operation contents of the image processing.

FIG. 11A is a block diagram showing the overall arrangement of a circuit of this embodiment, FIG. 11B is a circuit diagram showing the arrangement of a pixel portion of the circuit of this embodiment, and FIG. 11C is a schematic view for explaining the arithmetic operation contents of this embodiment.

Referring to FIG. 11A, the circuit includes light-receiving portions 141 each including a photoelectric conversion element, line memories 143, 145, 147, and 149, correlation calculation units 144 and 148, and an arithmetic operation output unit 150. The light-receiving portion 141 shown in FIG. 11B includes coupling capacitor means 151 and 152 for connecting optical signal output terminals and output bus lines 142 and 146, a bipolar transistor 153, capacitor means 154 connected to the base region of the bipolar transistor 153, and a switch MOS transistor 155. Image data input to an image data sensing unit 160 is photoelectrically converted by the base region of the bipolar transistor 153.

An output corresponding to the photoelectrically converted photocarriers is read out to the emitter of the bipolar transistor 153, and raises the potentials of the output bus lines 142 and 146 in accordance with an input stored charge signal via the coupling capacitor means 151 and 152. With the above-mentioned operation, the sum of the outputs from the pixels in the column direction is read out to the line memory 147, and the sum of the outputs from the pixels in the row direction is read out to the line memory 143. In this case, if a region where the base potential of the bipolar transistor is raised via the capacitor means 154 of each pixel portion is selected using, e.g., a decoder (not shown in FIGS. 11A to 11C), the sums in the X- and Y-directions of an arbitrary region on the sensing unit 160 can be output.

For example, as shown in FIG. 11C, when an image 156 is input at time $t_1$, and an image 157 is input at time $t_2$, output results 158 and 159 obtained by respectively adding these images in the Y-direction become image signals representing the moving state of a vehicle shown in FIG. 11C, and these data are respectively stored in the line memories 147 and 149 shown in FIG. 11A. Similarly, data obtained by adding image data in the X-direction are stored in the line memories 143 and 145.

As can be seen from the data string outputs 158 and 159 of image signals shown in FIG. 11C, the data of the two images shift in correspondence with the motion of the image. Thus, when the correlation calculation unit 148 calculates the shift amount, and the correlation calculation unit 144 similarly calculates data in the horizontal direction, the motion of an object on the two-dimensional plane can be detected by a very simple method.

The correlation calculation units 144 and 148 shown in FIG. 11A can comprise the correlation arithmetic operation circuit of the present invention. Each of these units has a smaller number of elements than the conventional circuit, and, in particular, can be at the sensor pixel pitch. This arrangement performs arithmetic operations on the basis of analog signals output from the sensor. However, when the A/D converter of the present invention is arranged between each line memory and the output bus line, a digital correlation arithmetic operation can be realized, needless to say.

The sensor element of the present invention comprises a bipolar transistor. However, the present invention is also effective for a MOS transistor or only a photodiode without arranging any amplification transistor.

Furthermore, this embodiment performs a correlation arithmetic operation between data strings at different times. Alternatively, when the X- and Y-projection results of a plurality of pattern data to be recognized are stored in one memory, pattern recognition can also be realized.

As described above, when the pixel input unit and the correlation arithmetic operation circuit or the like of the present invention are combined, the following effects are expected.

(1) Since data which are parallelly and simultaneously read out from the sensor are subjected to parallel processing unlike in the conventional processing for serially reading out data from the sensor, high-speed motion detection and pattern recognition processing can be realized.

(2) Since a 1-chip semiconductor device including a sensor can be constituted, and image processing can be realized without increasing the size of peripheral circuits, the following high-grade function products can be realized with low cost: (a) control equipment for turning the TV screen toward the user direction, (b) control equipment for turning the wind direction of an air conditioner toward the user direction, (c) tracing control equipment for an 8-mm VTR camera, (d) label recognition equipment in a factory, (e) reception robot that can automatically recognize a person, (f) inter-vehicle distance controller for a vehicle, and the like.

The integration of the image input unit and the circuit of the present invention has been described. The present invention is effective not only for image data but also for, e.g., recognition processing of audio data.

As described above, according to the present invention, since a circuit for performing parallel arithmetic operations for multiple variable signals can be constituted by a smaller number of transistors than a conventional logic circuit, and has high sensitivity to a weak signal, a high arithmetic operation speed and low consumption power can be attained.

Since signals having the same absolute value but opposite polarities can be written at the differential input terminals of the differential input/output type sense amplifiers, the differential gain of the sensing system can be increased, and ultra-high sensitivity detection can be realized. For this reason, the number of parallel processing operations can be increased, and the number of arithmetic operations per cycle can be increased. Since the differential input/output type sense amplifier can be constituted by MOS transistors, a small circuit scale, a small number of processing stages, and high-speed processing can be attained since a multiple-input stage can also be constituted by MOS transistors.

Furthermore, when the differential input/output type sense amplifier comprises a latch type sense amplifier, the sense amplifier itself has a storage function, and can output non-inverted and inverted signals. For this reason, high-precision data free from mixing of noise can be transferred, and when semiconductor devices of the present invention are connected in series with each other, the arrangement of the multiple-input stage can be further simplified.

When the semiconductor device of the present invention is applied to a majority circuit, an A/D or D/A converter, and a signal processing system, such a unit or system can be constituted by a chip having a small physical structure and a small circuit scale. Thus, the number of wiring lines can be reduced, mixing of external noise can be eliminated, and high-speed arithmetic operation processing can be realized.

The present invention is not limited to the above-mentioned embodiments, and various changes and modifications may be made within the scope of the invention.

TABLE 1

| Input | S3 | S2 | S1 |
|---|---|---|---|
| 0/7 | 0 | 0 | 0 |
| 1/7 | 0 | 0 | 1 |
| 2/7 | 0 | 1 | 0 |
| 3/7 | 0 | 1 | 1 |
| 4/7 | 1 | 0 | 0 |
| 5/7 | 1 | 0 | 1 |
| 6/7 | 1 | 1 | 0 |
| 7/7 | 1 | 1 | 1 |

TABLE 2

| Analog Input Voltage | S3 | S2 | S1 |
|---|---|---|---|
| 0.0 ≦ VA < 0.625 | 0 | 0 | 0 |
| 0.625 ≦ VA < 1.25 | 0 | 0 | 1 |
| 1.25 ≦ VA < 1.875 | 0 | 1 | 0 |
| 1.875 ≦ VA < 2.5 | 0 | 1 | 1 |
| 2.5 ≦ VA < 3.125 | 1 | 0 | 0 |
| 3.125 ≦ VA < 3.75 | 1 | 0 | 1 |
| 3.75 ≦ VA < 4.375 | 1 | 1 | 0 |
| 4.375 ≦ VA < 5.0 | 1 | 1 | 1 |

What is claimed is:

1. A semiconductor device comprising capacitor means having plural first terminals and plural second terminals, and a differential input/output type sense amplifier, wherein the first terminals of said capacitor means are connected to multiple input terminals via first switch means which can select a positive or negative logic of an input signal, the second terminals of said capacitor means are commonly connected to first differential input means of said differential input/output type sense amplifier via second switch means, and to second differential input means of said differential input/output type sense amplifier via third switch means, said second differential input means having a polarity opposite to a polarity of said first differential input means.

2. A device according to claim 1, further comprising first reset switch means connected to the commonly connected terminals of said capacitor means.

3. A device according to claim 2, further comprising second reset means connected to said first differential input/output type sense amplifier, and third reset means connected to said second differential input means of said differential input/output type sense amplifier.

4. A device according to claim 3, further comprising means for driving so as to provide overlap between a period of continuity of said first, second and third reset switch means and the reset period of said first input terminals during which the first terminals of said capacitor means are supplied through said first switch means with the input signal in the positive or negative logic.

5. A device according to claim 1, further comprising second reset means connected to said first differential input/output type sense amplifier, and third reset means connected to said second differential input means of said differential input/output type sense amplifier.

6. A device according to claim 1, further comprising means for driving said first switch means to perform a first input signal transfer period for supplying a signal to the first terminals of said capacitor means in a logic opposite to that of the signal supplied in a period in which the one terminal is reset, and for driving said second switch means to perform at least after the first input signal transfer period, a period of setting at a continuity said second switch means provided between the second terminal of said capacitor means and said first differential input means of said differential input/output type sense amplifier starts after a first input signal transfer period in which a signal of a logic opposite to the logic applied during the first capacitance input terminal reset period is written in one terminal of each of said capacitor means via said first switch means.

7. A device according to claim 1, further comprising:

a first reset means connected to the second terminal at which said capacitor means are commonly connected; and means for driving said first reset means to reset the other terminals through said first reset means after termination of the continuity period of said second switch means.

8. A device according to claim 1, further comprising means for driving said first switch means to perform a second input signal transfer period for inputting a signal into the one of said capacitor means again in the same logic as that for reset of the first terminals of said capacitor means through said first switch means, and for driving said third switch means to perform, at least after the second input signal transfer period, a continuity period of said third switch means provided between the second terminal of said capacitor means and the second differential input means of said differential input/output type sense amplifier.

9. A device according to claim 8, further comprising means for driving said differential input/output type sense amplifier to amplify and output the differential output, the amplifying being to amplify the signal into a logic amplitude level, from a level of a difference between the amplifier input maintained by said first differential input means by driving said first switch means for performing first input signal transfer period to supply a signal to the second terminal of said capacitor means in a logic opposite to that for supplying a reset period of the other terminal connected to said capacitor means through said first switch means, and an amplifier input voltage level maintained by said second differential input means by driving said first switch means to perform the second input signal transfer period for inputting a signal into the one of said capacitor means again in the same logic as that for the reset period of the first terminal of said capacitor means through said first switch means.

10. A device according to claim 1, wherein said differential input/output type sense amplifier has an input stage which comprises a differential pair constituted by transistors having the same polarity, and can amplify an input signal to a logic amplitude level with a polarity according to an input potential difference of said differential pair.

11. A-device according to claim 10, wherein said differential output type amplifier can be turned on/off by an external control signal, and has a function of holding a previous arithmetic operation result before said amplifier is turned off.

12. A device according to claim 1, wherein said differential input/output type sense amplifier is a latch type sense amplifier utilizing a positive feedback effect.

13. A device according to claim 11, wherein said latch type sense amplifier has a function of enabling/disabling an amplification effect due to the positive feedback effect by an external control signal.

14. A semiconductor comprising a semiconductor device comprising capacitor means having plural first terminals and plural second terminals, and a differential input/output type sense amplifier, wherein first terminals of said capacitor means are connected to multiple input terminals via first switch means which can select a positive or negative logic of an input signal, the second terminals of said capacitor means are commonly connected to first differential input means of said differential input/output type sense amplifier via second switch means, and to second differential input means of said differential input/output type sense amplifier via third switch means, said second differential input means having a polarity opposite to a polarity of said first differential input means, wherein, when a minimum capacitance of the capacitances of said capacitor means is represented by C, a total of capacitances of said commonly connected capacitor means is substantially equal to an odd positive integer multiplied by C.

15. A correlation calculation apparatus for performing a correlation arithmetic operation using a semiconductor circuit comprising first and second semiconductor devices, each having a differential input/output type sense amplifier and capacitor means which has first terminals and second terminals, connected respectively to input terminals through a first switch means which can select positive or negative logic of an input signal, and said second terminals being commonly connected through second switch means to a first different input means of said differential input/output type sense amplifier, and said second terminals of said capacitor means being connected through a third switch means to a second differential input means of a polarity opposite to the first differential input means of said differential input/output type sense amplifier, wherein said first and second semiconductor devices are connected so that an inversion output from said first semiconductor device is input to said second semiconductor device.

16. A signal converter which comprises a semiconductor device comprising capacitor means having plural first terminals and plural second terminals, and a differential input/output type sense amplifier, wherein first terminals of said capacitor means are connected to multiple input terminals via first switch means which can select a positive or negative logic of an input signal, the second terminals of said capacitor means are commonly connected to first differential input means of said differential input/output type sense amplifier via second switch means, and to second differential input means of said differential input/output type sense amplifier via third switch means, said second differential input means having a polarity opposite to a polarity of said first differential input means, wherein an analog signal is input to said semiconductor device, and a digital signal is output corresponding to the analog signal.

17. A signal converter which comprises a semiconductor device comprising capacitor means having plural first terminals and plural second terminals, and a differential input/output type sense amplifier, wherein first terminals of said capacitor means are connected to multiple input terminals via first switch means which can select a positive or negative logic of an input signal, the second terminals of said capacitor means are commonly connected to first differential input means of said differential input/output type sense amplifier via second switch means, and to second differential input means of said differential input/output type sense amplifier via third switch means, said second differential input means having a polarity opposite to a polarity of said first differential input means, wherein a digital signal is input to the semiconductor device, and an analog signal is output corresponding to the digital signal.

18. A signal processing system comprising a correlation calculation apparatus for performing a correlation arithmetic operation using a semiconductor circuit which comprises first and second semiconductor devices, each having a differential input/output type sense amplifier and capacitor means which has first terminals and second terminals, connected respectively to input terminals through a first switch means which can select positive or negative logic of an input signal, and said second terminals being commonly connected through second switch means to a first differential input means of said differential input/output type sense amplifier, and said second terminals of said capacitor means being connected through a third switch means to a second differential input means of a polarity opposite to the first differential input means of said differential input/output type sense amplifier, wherein said first and second semiconductor devices are connected so that an inversion output from said first semiconductor device is input to said second semiconductor device.

19. A system according to claim 18, further comprising an image input device for inputting an image signal.

20. A system according to claim 18, further comprising a storage device for storing information.

21. A signal processing system comprising a signal converter which comprises a semiconductor device comprising capacitor means having plural first terminals and plural second terminals, and a differential input/output type sense amplifier, wherein first terminals of said capacitor means are connected to multiple input terminals via first switch means which can select a positive or negative logic of an input signal, the second terminals of said capacitor means are commonly connected to first differential input means of said differential input/output type sense amplifier via second switch means, and to second differential input means of said differential input/output type sense amplifier via third switch means, said second differential input means having a polarity opposite to a polarity of said first differential input means.

wherein an analog signal is input to said semiconductor device, and a digital signal is output corresponding to the analog signal.

22. A signal processing system comprising a signal converter which comprises a semiconductor device comprising capacitor means having plural first terminals and plural second terminals, and a differential input/output type sense amplifier, wherein first terminals of said capacitor means are connected to multiple input terminals via first switch means which can select a positive or negative logic of an input signal, the second terminals of said capacitor means are commonly connected to first differential input means of said differential input/output type sense amplifier via second switch means, and to second differential input means of said differential input/output type sense amplifier via third switch means, said second differential input means having a polarity opposite to a polarity of said first differential input means, wherein a digital signal is input to the semiconductor device, and an analog signal is output corresponding to the digital signal.

23. A semiconductor apparatus comprising first and second semiconductor devices, each having a differential input/output type sense amplified and capacitor means which has first terminals and second terminals, connected respectively to input terminals through a first switch means which can select positive or negative logic of an input signal, and said second terminals being commonly connected through second switch means to a first differential input means of said differential input/output type sense amplifier, and said second terminals of said capacitor means also being connected through a third switch means to a second differential input means of a polarity opposite to the first differential input means of said differential input/output type sense amplifier, wherein said first and second semiconductor devices are connected so that an inversion output from said first semiconductor device is input to said second semiconductor device.

* * * * *

UNITED STATES PATENT AND TRADEMARK OFFICE
CERTIFICATE OF CORRECTION

PATENT NO. : 5,926,057
DATED : July 20, 1999
INVENTOR(S) : KATSUHISA OGAWA, ET AL.          Page 1 of 2

It is certified that error appears in the above-identified patent and that said Letters Patent is hereby corrected as shown below:

Title page, item
[57] ABSTRACT

"One" should read --First--.

COLUMN 1

Line 54, "of" should be deleted.

COLUMN 2

Line 9, "one" should read --first--.

COLUMN 7

Line 42, "Since the above formula (8)" should be deleted.

COLUMN 10

Line 18, "lapse" should read --lapse of--.

UNITED STATES PATENT AND TRADEMARK OFFICE
CERTIFICATE OF CORRECTION

PATENT NO. : 5,926,057
DATED : July 20, 1999
INVENTOR(S) : KATSUHISA OGAWA, ET AL.

It is certified that error appears in the above-identified patent and that said Letters Patent is hereby corrected as shown below:

<u>COLUMN 21</u>

Line 34, "A-device" should read --A device--.

<u>COLUMN 23</u>

Line 19, "means." should read --means,--.

<u>COLUMN 24</u>

Line 13, "amplified" should read --amplifier--.

Signed and Sealed this

Fourteenth Day of March, 2000

*Attest:*

Q. TODD DICKINSON

*Attesting Officer*    *Commissioner of Patents and Trademarks*